(12) United States Patent
Kanazawa

(10) Patent No.: US 8,726,100 B2
(45) Date of Patent: May 13, 2014

(54) NON-TRANSITORY COMPUTER-READABLE RECORDING MEDIUM IN WHICH A FAILURE ANALYZING PROGRAM IS RECORDED, FAILURE ANALYZING APPARATUS, AND METHOD FOR ANALYZING FAILURE

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 372 days.

(21) Appl. No.: 13/316,851

(22) Filed: Dec. 12, 2011

(65) Prior Publication Data

US 2012/0204063 A1 Aug. 9, 2012

(30) Foreign Application Priority Data

Feb. 3, 2011 (JP) ................... 2011-021784

(51) Int. Cl.
*G06F 11/00* (2006.01)
(52) U.S. Cl.
USPC ............................................. 714/47.3
(58) Field of Classification Search
CPC ............. G06F 11/006; G06F 11/3447; G06F 11/3452; G06F 11/3457; G06F 11/3466; G06F 11/3055; G06F 11/3065
USPC .................... 714/33, 37, 47.1–47.3
See application file for complete search history.

(56) References Cited

U.S. PATENT DOCUMENTS

| | | | |
|---|---|---|---|
| 6,499,133 B1 | 12/2002 | Kurokawa et al. | |
| 7,266,746 B2 | 9/2007 | Hiraide | |
| 7,594,206 B2 * | 9/2009 | Yoshida et al. | 716/136 |
| 7,644,046 B1 * | 1/2010 | Keeton et al. | 705/400 |
| 8,612,043 B2 * | 12/2013 | Moyne et al. | 700/109 |
| 2004/0181145 A1 * | 9/2004 | Al Bandar et al. | 600/408 |
| 2005/0066239 A1 * | 3/2005 | Keeton et al. | 714/47 |
| 2006/0064287 A1 * | 3/2006 | Standingford et al. | 703/2 |
| 2007/0101202 A1 * | 5/2007 | Garbow | 714/47 |
| 2013/0238266 A1 * | 9/2013 | Savvides et al. | 702/61 |

FOREIGN PATENT DOCUMENTS

| | | |
|---|---|---|
| JP | 6-083803 | 3/1994 |
| JP | 2000-268073 | 9/2000 |
| JP | 2003-524831 | 8/2003 |
| WO | WO-01/39098 A2 | 5/2001 |
| WO | WO-2004/027440 A1 | 4/2004 |

* cited by examiner

*Primary Examiner* — Bryce Bonzo
(74) *Attorney, Agent, or Firm* — Fujitsu Patent Center

(57) ABSTRACT

Among the combinations of failure candidates which combinations are generated by a generator, one combination that minimizes a cost derived in a cost calculator is selected. For the selected combination of failure candidates, a function, which specifically provides a correlation between one or more failure factor and an error (or error rate) of each failure element is output. A correct failure factor is estimated on the basis of the function.

20 Claims, 18 Drawing Sheets

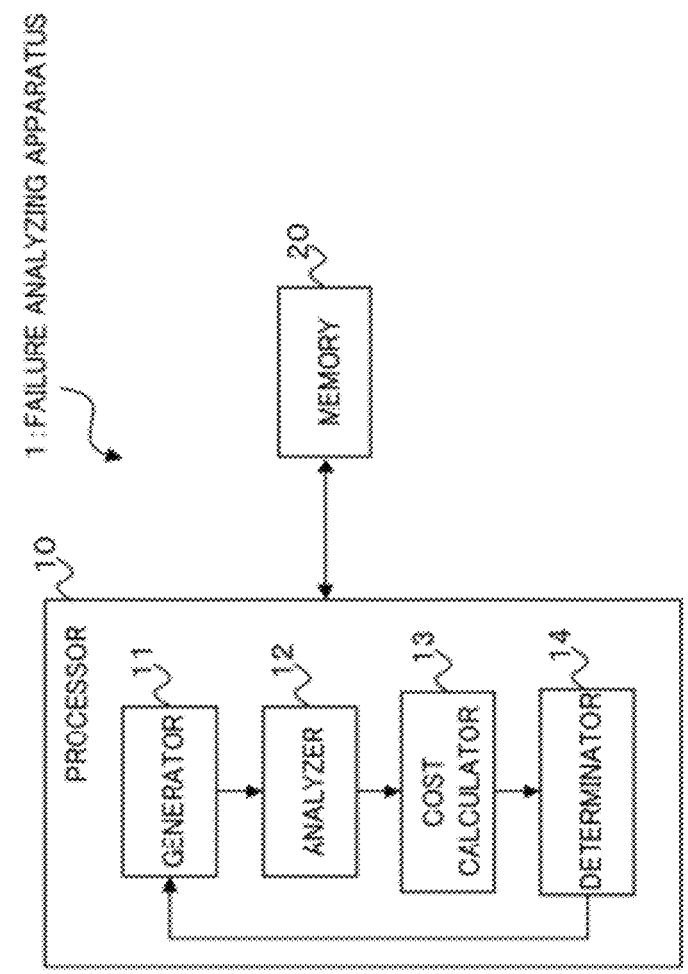

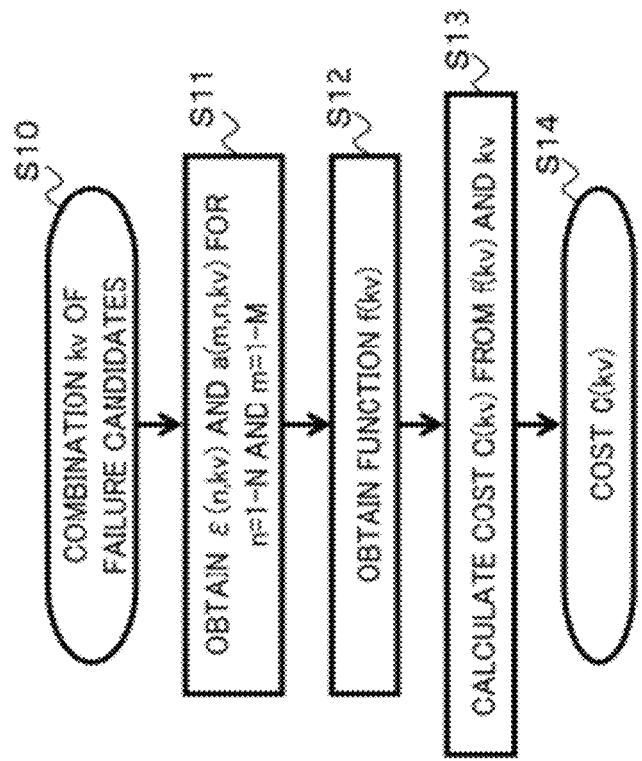

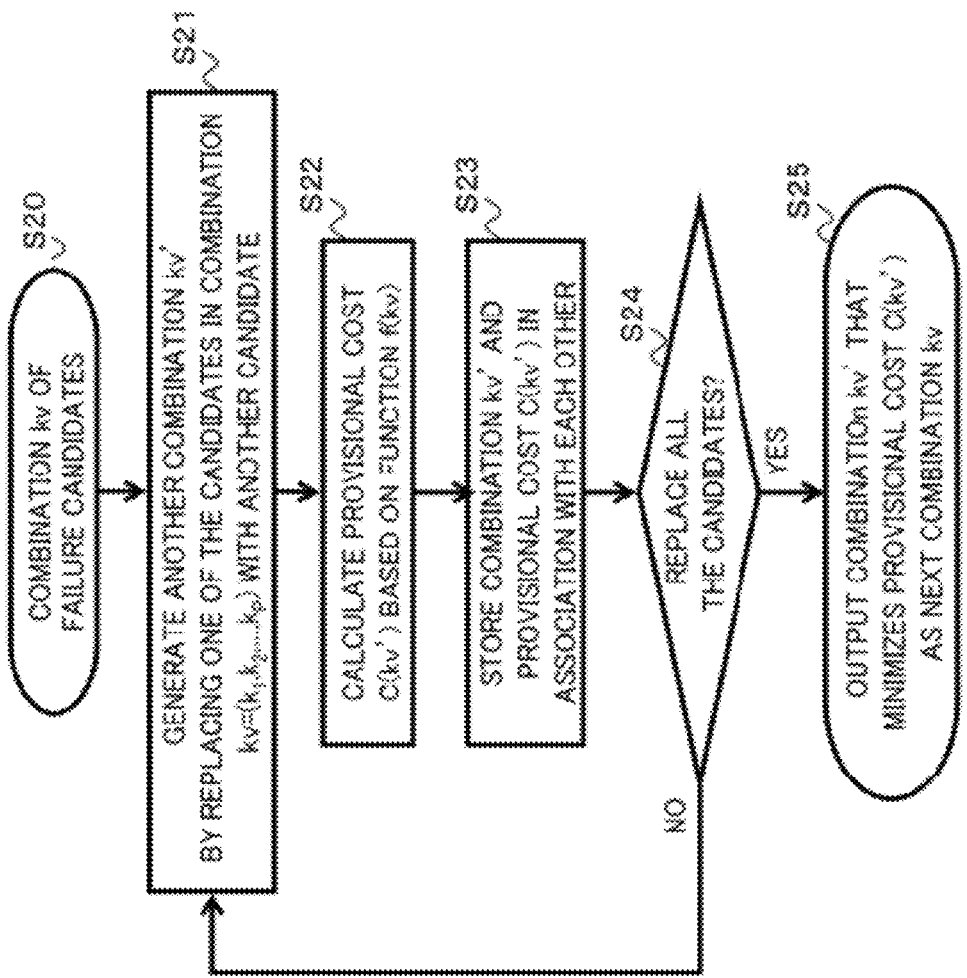

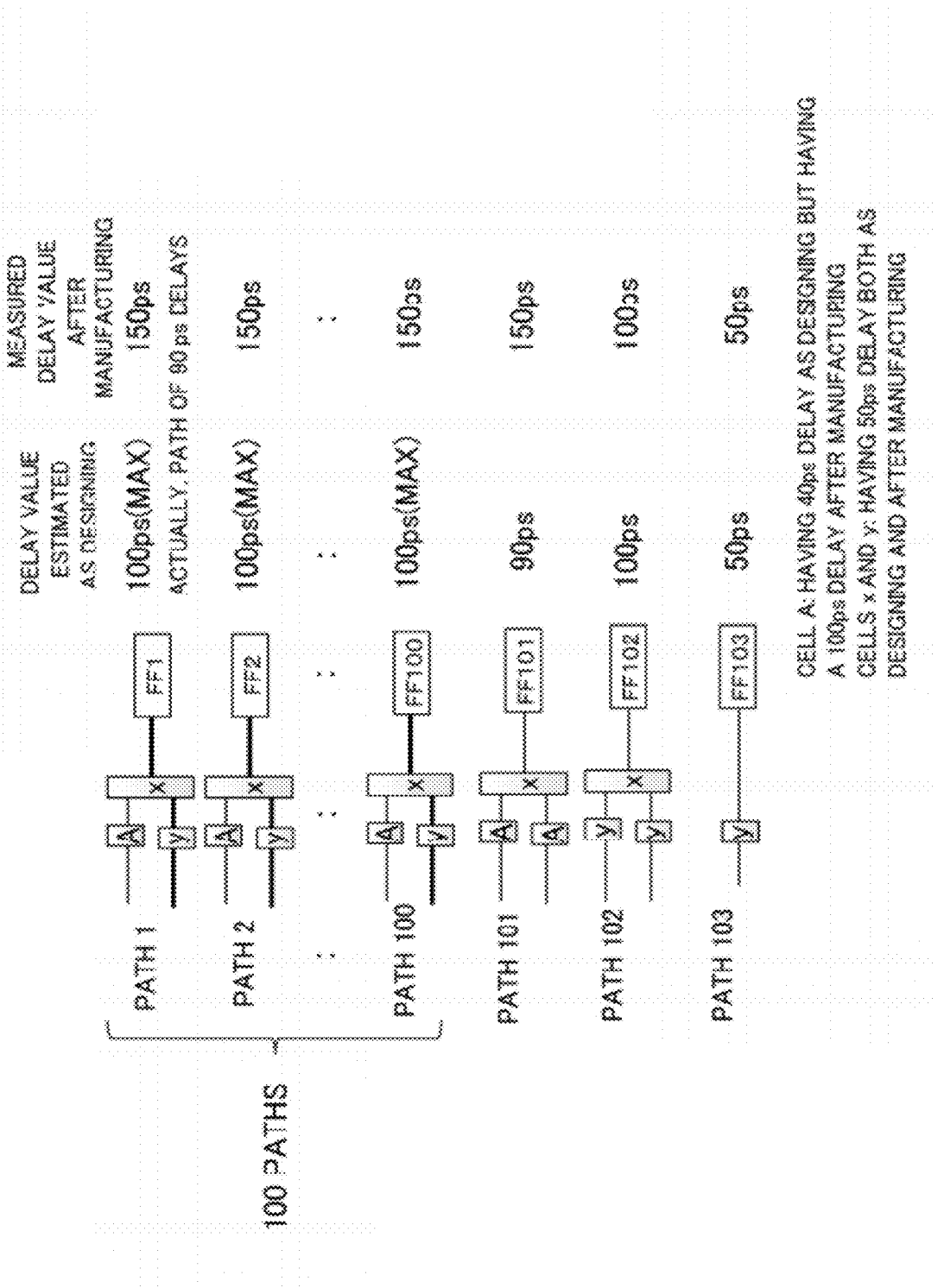

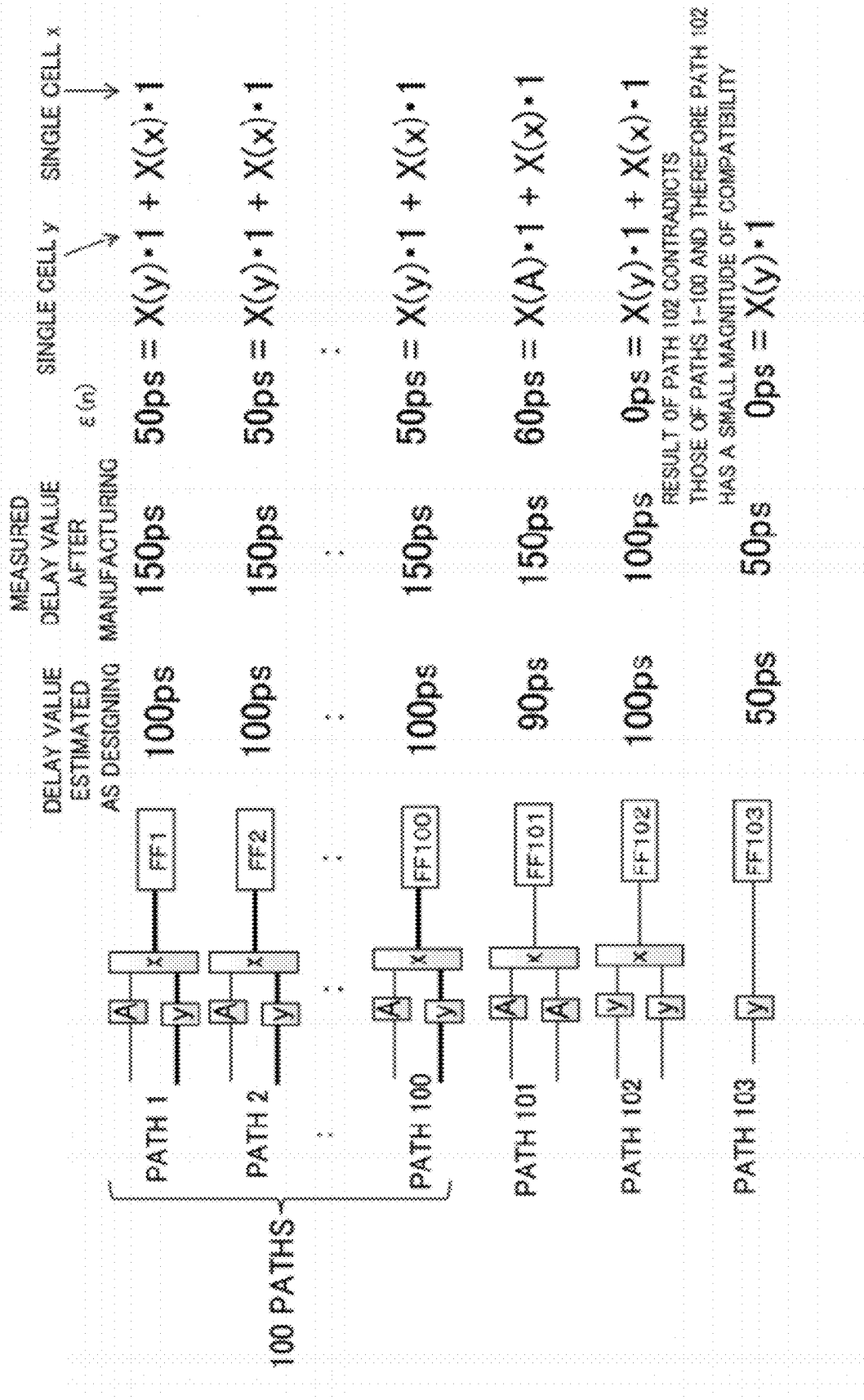

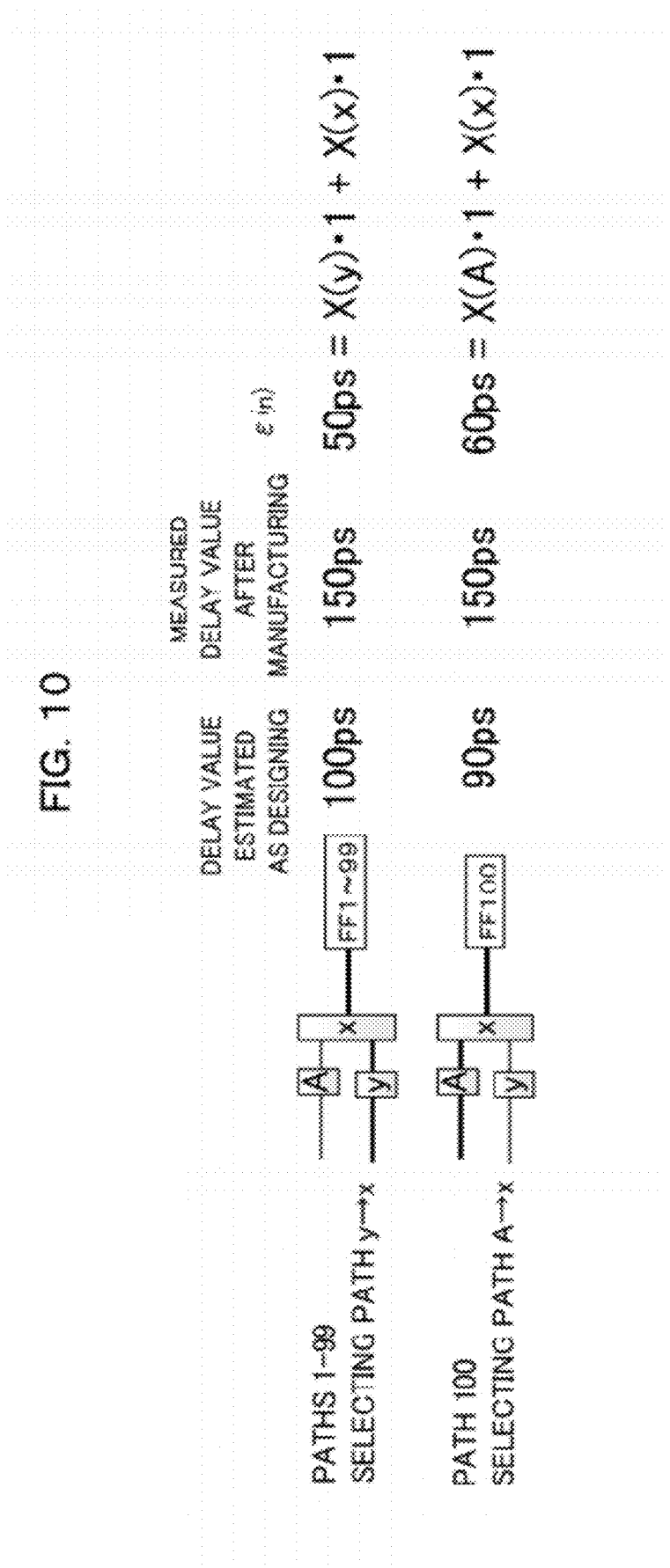

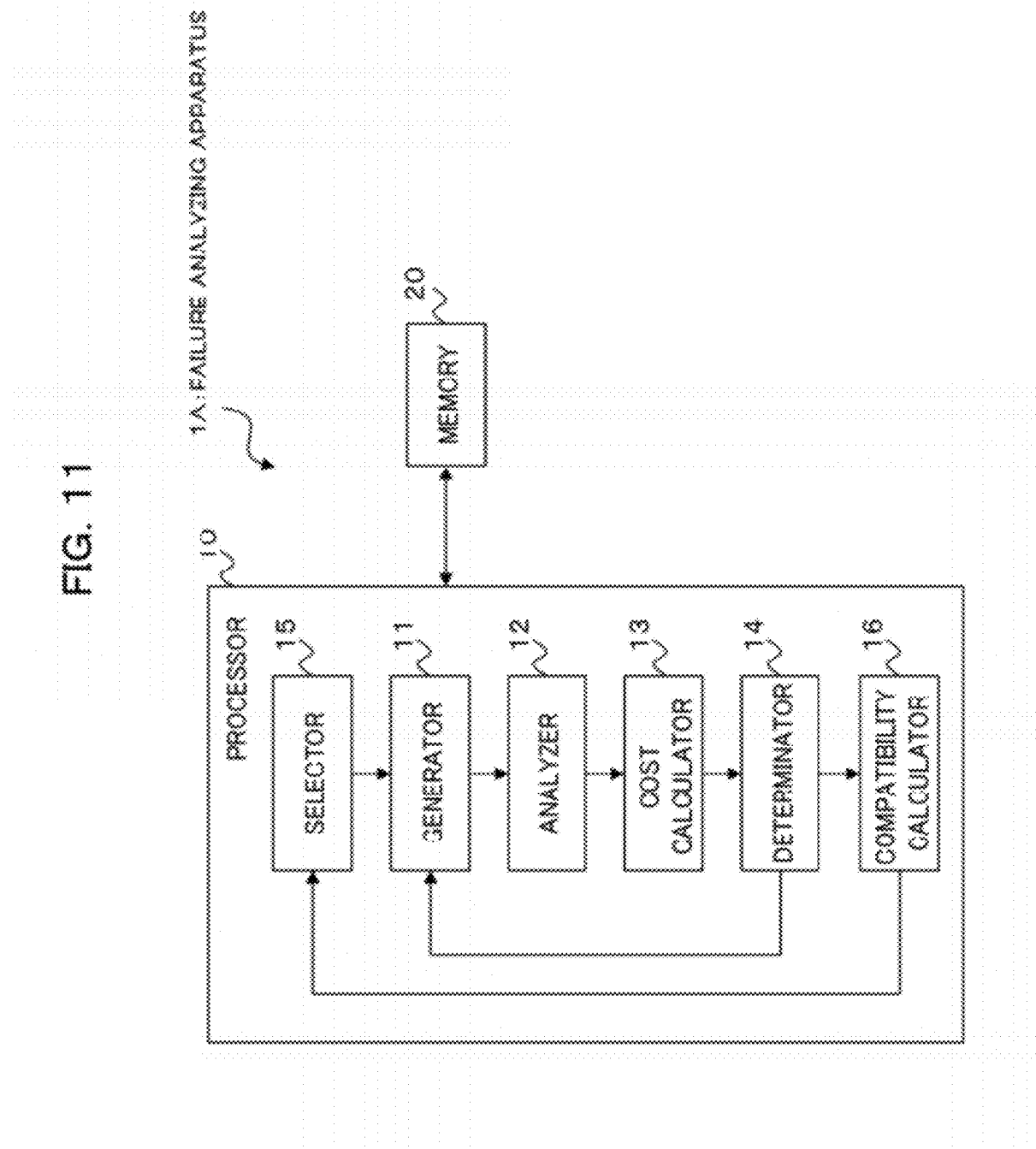

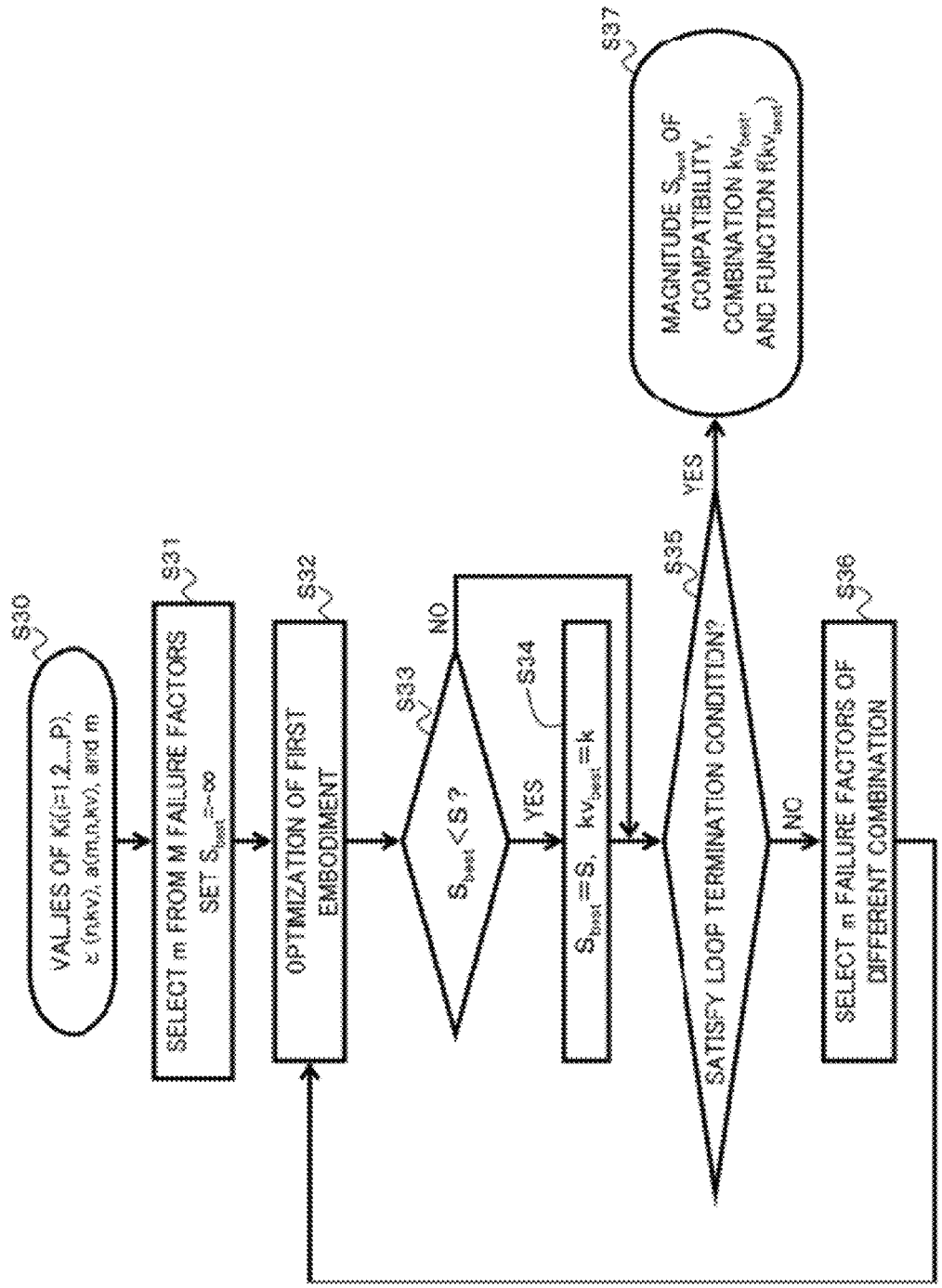

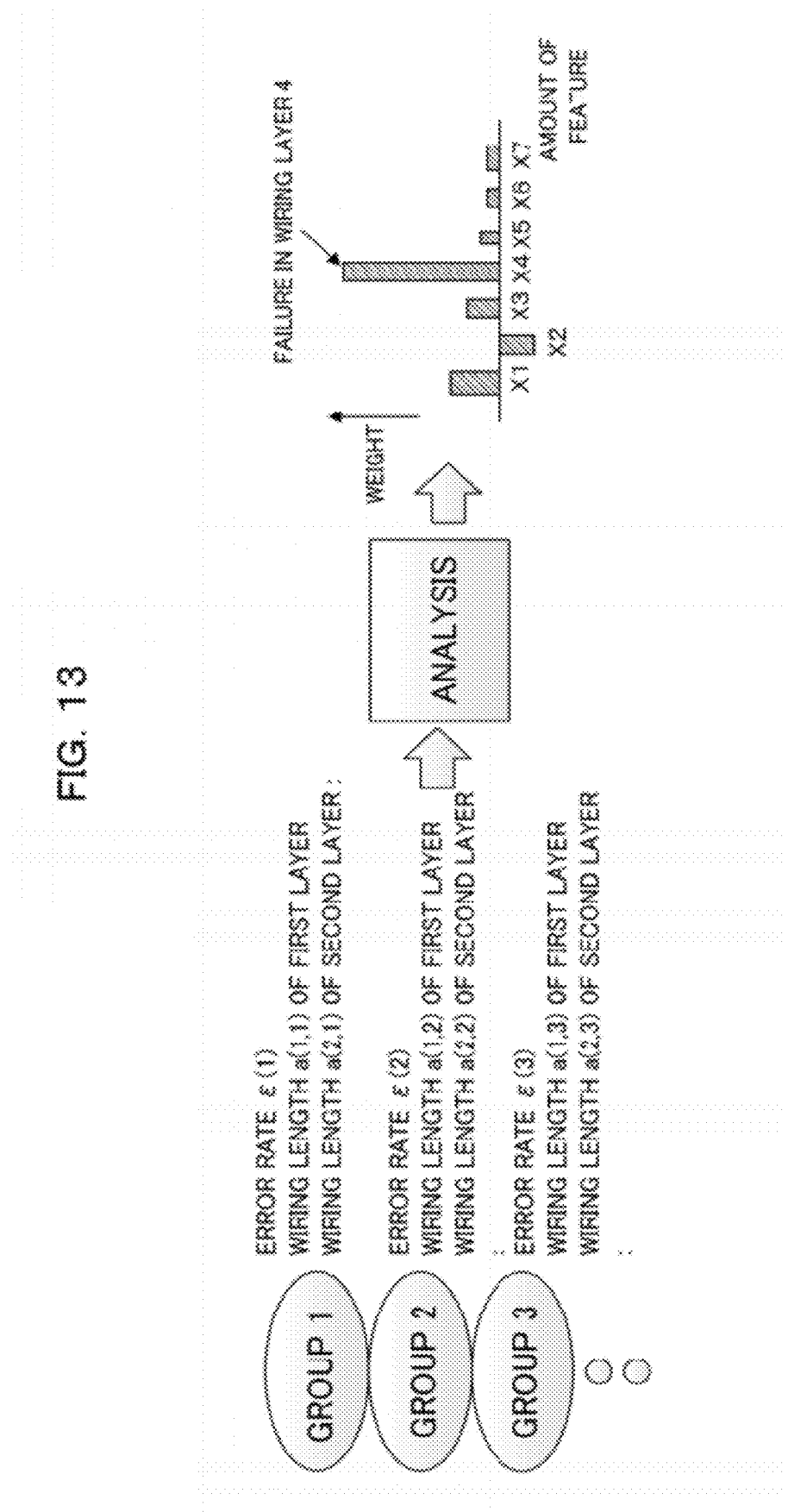

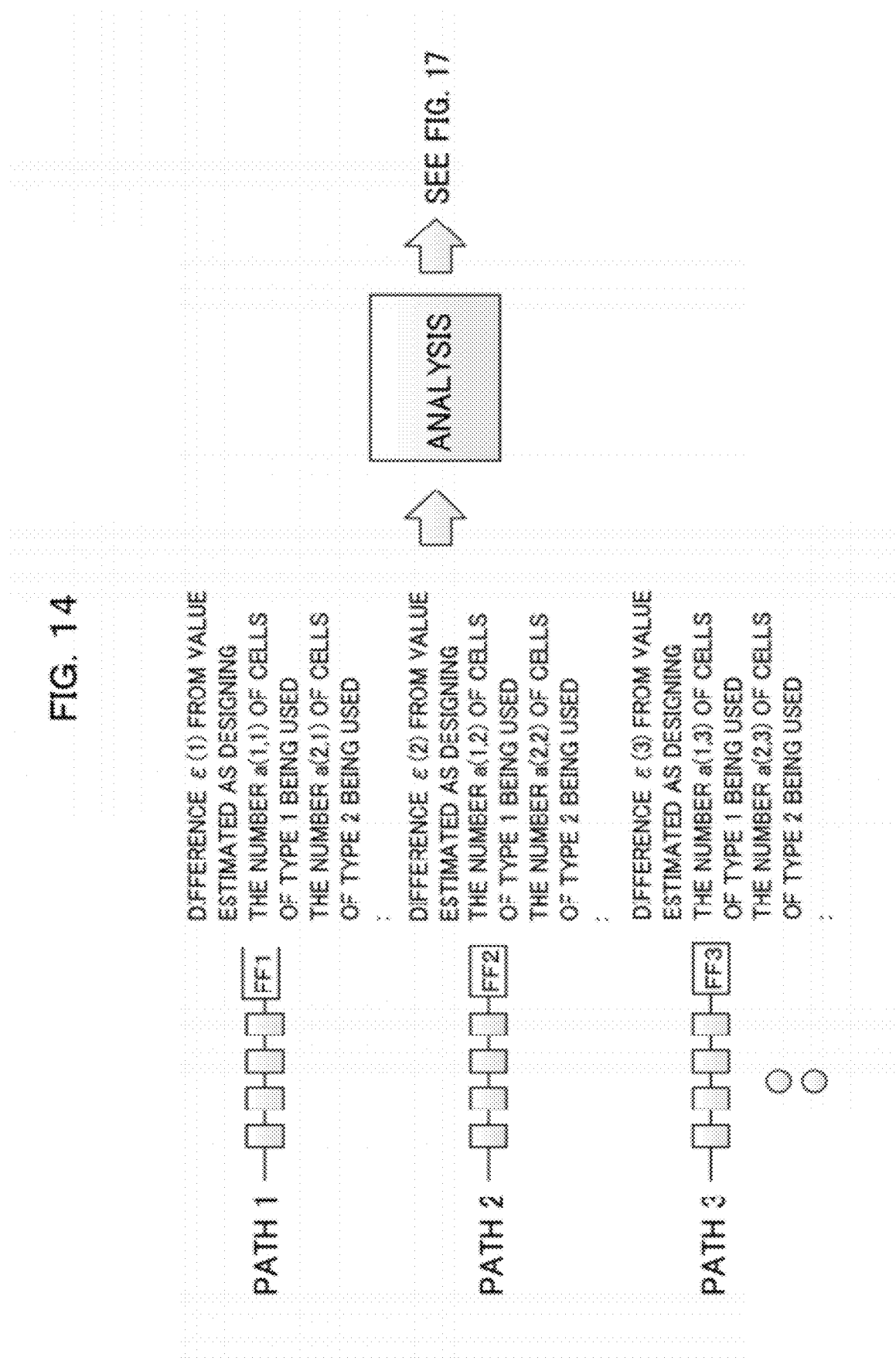

NON-TRANSITORY COMPUTER-READABLE RECORDING MEDIUM IN WHICH A FAILURE ANALYZING PROGRAM IS RECORDED, FAILURE ANALYZING APPARATUS, AND METHOD FOR ANALYZING FAILURE

CROSS-REFERENCE TO RELATED APPLICATION

This application is based upon and claims the benefit of priority of the prior Japanese Application No. 2011-021784 filed on Feb. 3, 2011 in Japan, the entire contents of which are hereby incorporated by reference.

FIELD

The embodiments discussed herein are related to a non-transitory computer-readable recording medium in which a failure analyzing program is recorded, a failure analyzing apparatus, and a method for analyzing failure.

BACKGROUND

In designing and manufacturing a chip exemplified by an integrated circuit such as a Large Scale Integration (LSI), a manufactured chip undergoes an error cause analysis and a speed path analysis. The error cause analysis checks a cause of an error, that is, the cause of not increasing the yield of an LSI. The speed path analysis seeks a reason why a time for propagating a signal from an input register to the output register on the actual chip is longer than a time estimated at the designing. Hereinafter, such error cause analysis and speed path analysis may sometimes be collectively called a "failure analysis".

A general failure analysis is carried out in, for example, the following steps (i) through (iv).

(i) In relation to N (natural number) elements of an actual chip to be designed, estimated values at the designing and measured values on the actual chip are previously derived. Here, representing respective estimated values of elements n (n=1, 2, . . . , N) at the designing by $T_{design}(n)$; respective measured values of the elements n on the actual chip by $T_{product}(n)$; and respective errors (or failure rate or error rate) of the elements n by $\epsilon(n)$, the relationship expressed by the following Formula (1) is established for each element n.

$$T_{product}(n) = T_{design}(n) + \epsilon(n) \quad (1)$$

(ii) Assuming candidates for a failure factor to be M (natural number) kinds, the magnitude of influence of m-th factor m (m=1, 2, . . . , and M) of the n-th element n (or the partial circuit n thereof) is derived and is represented by a (m, n).

(iii) A function f (see Formula (2) below) that gives the correlation between a failure factor m and an error $\epsilon(n)$ of each failure element n is derived.

$$\epsilon(n) = f(a(1,n), a(2,n), \ldots, a(M,n)) \quad (2)$$

The function f is derived through a regression analysis or through machine learning using, for example, a Support Vector Machine (SVM). In a simple case, the function f that uses a magnitude am of influence (an amount of feature) am of each factor m as variables is determined to be the following Formula (3), and weights X1, X2, . . . , Xm, . . . , and XM that provide the best approximations to N $\epsilon(n)$ are derived through a linear regression analysis.

$$f(a1, a2, \ldots, am, \ldots, aM) = a1 \times X1 + a2 \times X2 + \ldots + am \times Xm + \ldots + aM \times XM \quad (3)$$

Specifically, the following simultaneous equations (4-1) through (4-N) are solved through a linear regression analysis to calculate the weights X1, X2, Xm, . . . and, XM.

$$\epsilon(1) = a(1,1) \times X1 + a(2,1) \times X2 + \\ \ldots + a(m,1) \times Xm + \ldots + a(M,1) \times XM \quad (4\text{-}1)$$

$$\vdots \qquad \vdots$$

$$\epsilon(n) = a(1,n) \times X1 + a(2,n) \times X2 + \\ \ldots + a(m,n) \times Xm + \ldots + a(M,n) \times XM \quad (4\text{-}n)$$

$$\vdots \qquad \vdots$$

$$\epsilon(N) = a(1,N) \times X1 + a(2,N) \times X2 + \\ \ldots + a(m,N) \times Xm + \ldots + a(M,N) \times XM \quad (4\text{-}N)$$

The coefficient of a(m, n) in the above Formulae (4-1) through (4-N) represents the value representing a magnitude of influence (an amount of feature) of the factor m on the element n. The value a(m, n) is derived from information of designing the actual chip. Specifically, the value a(m, n) represents a length of wiring on a wiring layer m of a group (partial circuit) n, or the number of cells being used and belonging to a cell type m on an activated path connected to an output register (flip flop) n, as to be detailed below.

(iv) From the form of the function f derived in above step (iii), a factor of the failure is estimated. For example, after the weights X1 through XM are calculated and the function f of Formula (3) is derived, the factor having a weight of the maximum absolute value is estimated to have the largest influence. For example, when the weight Xm has the maximum absolute value, the factor m (the cell type m or the wiring layer m) is estimated to be the cause of the failure.

Next, the error cause analysis and the speed path analysis will now be detailed with reference to FIGS. 13, 14, and 17.

If errors frequently occur in the actual chip, the cause of the failure is checked through the error cause analysis. For example, if a problem arises when the fourth layer is manufactured or a net having a long wiring on the fourth layer has a high error rate, the error cause analysis estimates that the fourth layer (the wiring layer 4) to be the cause of the failure.

In the error cause analysis, nets of the chip are classified into N groups (elements) 1 through N as depicted on the left side of FIG. 13, and the total of wiring length of each wiring layer of each group n is derived as a magnitude a(m, n) of influence (an amount of feature). The error rate $\epsilon(n)$ of each group n is obtained on the basis of the result of measurement on the actual chip. The magnitude a (m, n) of influence and the error rate $\epsilon(n)$ derived in the above manner are applied to Formulae (4-1) through (4-N) to calculate the weights X1 through XM as depicted on the right side of FIG. 13. Apparently from the calculated weights X1 through XM, the weight X4 corresponding to the wiring length of the fourth layer has the maximum absolute value and concurrently exceeds the reference value, and therefore, the wiring layer 4 is estimated to be the cause of the failure.

Otherwise, if a manufactured actual chip does not attain the designed performance, the factor of the failure is checked through the speed path analysis. For example, if cells of a particular cell type have a measured delay value larger than the estimated delay time estimated at designing or a path including many cells of the same cell type has a measured delay value larger than the estimated delay time at designing, the particular cell type is estimated to be a delay factor.

In the speed path analysis, N FF (Flip Flop) elements 1 through N that have measured delay values larger than respective estimated delay value estimated at designing are assumed to be found as depicted in the left side of FIG. 14. To the input side of each FFn, a single activated path n is connected, and the number of cells of the cell type m (Type m) being used on the activated path is derived as a magnitude a(m, n) of influence (an amount of feature). Concurrently, the delay error ϵ(n) on each FFn (path n) corresponds to the deference between the measured delay value on the actual chip and the estimated delay value at designing. The magnitude a(m, n) and delay error ϵ(n) derived in the above manner are applied to Formulae (4-1) through (4-N) and thereby the weights X1 through XM are calculated as illustrated in FIG. 17. In the example of FIG. 17, the weights X63, X72, and X153 of cell types f_63, f_72, and f_153, respectively have absolute values exceeding a reference value. The three kinds of cell types f_63, f_72, and f_153 are estimated to be the cause of the failure, i.e., delay.

Next, description will now be made in relation to problems of the error cause analysis and problems of the speed path analysis with reference to FIGS. 15-18.

First, problems of the error cause analysis will be explained. In the example of FIG. 15, the net system is formed by connecting five nets (regions) N1-N5 to one another via four buffers B1-B4. A case is assumed where occurrence of a failure in the net system is acknowledged but the precise position at which the failure is occurring is not acknowledged for the five nets N1-N5. In this case, the candidates (failure candidates) for a region to be specified as the failure occurrence region are the five nets N1 through N5, at least one of which is selected as the group n, which is then subjected to the error cause analysis.

If, for example, the wiring layer 4 is the cause of the failure and each net using the wiring layer 4 in question is selected as the group n among the five nets, the information of the wiring layer 4 is reflected in the result of the error cause analysis and the wiring layer 4 is specified as the cause. Conversely, if a net not using the wiring layer 4 in question is selected as the group n from the five nets, there is a possibility of the error in the result of the analysis. The above error cause analysis does not always output an erroneous result even if one or more of the groups select an incorrect net (i.e., so as not containing the failure wiring layer). However, if an excessive number of groups select incorrect nets, the possibility of error in the result of the analysis is increased to make it impossible to specify the correct failure cause.

Next, problems in the speed path analysis will now be described. In the example of FIG. 16, two activated paths P1 and P2 reach the FFn that occurring delay failure through a two-input one-output gate G. In this case, occurrence of the failure in the FFn is acknowledged by the measured delay value and the estimated delay value estimated at designing, but whether the cause of the delay failure is activated path P1 or P2 is not grasped. So, one of the two activated paths P1 and P2 is selected as the activated path n, which is then subjected to the speed path analysis.

For example, if the activated path P2 is the cause of the delay and the activated path P2 is selected as the path n related to the FFn, the cell information of the activated path P2 and other information are reflected in the result of the speed path analysis, so that a cell type of a cell on the activated path is specified as the cause. Conversely, if the activated path P1 not being the cause of the delay is selected as the path n related to the FFn, there is a possibility of error in the result of the analysis. The above speed path analysis does not always output an erroneous result even if incorrect activated paths are selected for part of the FFs. However, if an excessive number of FFs select incorrect activated paths, the possibility of error in the result of the analysis is increased to make it impossible to specify the correct failure cause.

Here, an example of the result of the speed path analysis will be detailed with reference to FIGS. 17 and 18. FIG. 17 is a diagram illustrating an example of an analysis result when the failure candidates are correctly selected while FIG. 18 is a diagram illustrating an example of an analysis result when the failure candidates are incorrectly selected. FIGS. 17 and 18 concern an experimental example of the speed path analysis in which example three kinds of cell type among about 500 paths are regarded as failure causes and three cell types f_63, f_72, and f_153 are experimented to be detected through the speed path analysis.

FIG. 17 represents an example in which a correct activated path that reaches each FFn is selected as a cause of the delay, in other words, failure candidates are correctly selected. If failure candidates are correctly selected as illustrated in FIG. 17, the absolute values of the weights X63, X72, and X153 of the cell types f_63, f_72, and f_153 exceed a constant value (threshold) and therefore can be estimated to be the causes of the delay.

FIG. 18 represents an example in which a correct activated path that reaches each FFn in not selected as a cause of the delay, in other words, failure candidates are incorrectly selected. If failure candidates are incorrectly selected as illustrated in FIG. 18, the absolute values of weights of many cell types exceed the threshold and therefore the causes the delay are not correctly estimated.

[Patent Literature 1] pamphlet of WO 2004-027440
[Patent Literature 2] Japanese Laid-Open Patent Publication No. HEI 06-083803
[Patent Literature 3] Japanese Laid-Open Patent Publication No. 2000-268073
[Patent Literature 4] Japanese National Publication of International Patent Application No. 2003-524831.

SUMMARY

According to an aspect of the embodiments, there is provided a non-transitory computer-readable recording medium which stores a failure analyzing program that derives a function that provides a correlation between a plurality of failure factors and an error or a failure rate of each of a plurality of failure elements indicating occurrence of a failure on an actual chip of the basis of result of measurement on the actual chip and estimates a correct failure factor on the basis of the function, the failure analyzing program instructing a computer to execute: if each of the plurality of failure elements includes a number of failure candidates including a first failure factor that causes the failure in the element, generating a combination of failure candidates one for each of the plurality of failure elements; deriving the function based on the generated combination of failure candidates; calculating a cost of the derived function; and selecting one of a plurality of the generated combinations of failure candidates that minimizes the cost.

According to another aspect of the embodiments, there is provided a failure analyzing apparatus for deriving a function that provides a correlation between a plurality of failure factors and an error or a failure rate of each of a plurality of failure elements indicating occurrence of a failure of an actual chip on the basis of result of measurement on the actual chip and estimating a correct failure factor on the basis of the derived function, the apparatus comprising: a generator that generates, if each of the plurality of failure elements includes a number of failure candidates including a first failure factor that causes the failure in the element, a combination of failure candidates one for each of the plurality of failure elements; an analyzer that derives the function based on the combination of failure candidates generated by the generator; a cost calculator that calculates a cost of the function derived by the analyzer; and a determinator that selects one of a plurality of the combinations generated by the generator that minimizes the cost calculated by the cost calculator.

According to a further aspect of the embodiments, there is provided a method for failure analysis that, on a computer, derives a function that provides a correlation between a plurality of failure factors and an error or a failure rate of each of a plurality of failure elements indicating occurrence of a failure of an actual chip on the basis of result of measurement on the actual chip and estimates a correct failure factor on the basis of the derived function, the method including: if each of the plurality of failure elements includes a number of failure candidates including a first failure factor that causes the failure in the element, generating a combination of failure candidates one for each of the plurality of failure elements; deriving the function based on the generated combination of failure candidates; calculating a cost of the derived n function; and selecting one of a plurality of the generated combinations of failure candidates that minimizes the cost.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 1 is a block diagram schematically illustrating the functional configuration of a failure analyzing apparatus according to a first embodiment;

FIG. 5 is a flow diagram illustrating a succession of procedural steps of calculating a cost by the failure analyzing apparatus of the first embodiment;

FIG. 6 is a flow diagram illustrating a succession of procedural steps of generating a combination of failure candidates by the failure analyzing apparatus of the first embodiment;

FIG. 8 is a diagram illustrating a simplified and specified example of analysis performed by the failure analyzing apparatus of the first embodiment;

FIG. 9 is a diagram illustrating a simplified and specified example of analysis of the failure analyzing apparatus of the first embodiment;

FIG. 10 is a diagram illustrating a simplified and specified example of analysis performed by the failure analyzing apparatus of the first embodiment;

FIG. 11 is a block diagram schematically illustrating the functional configuration performed by a failure analyzing apparatus according to a second embodiment;

FIG. 12 is a flow diagram illustrating a succession of procedural steps of analysis performed by the failure analyzing apparatus of the second embodiment;

FIG. 13 is a diagram illustrating an error cause analysis;

FIG. 14 is a diagram illustrating a speed path analysis;

DESCRIPTION OF THE PREFERRED EMBODIMENTS

Figure 2B:
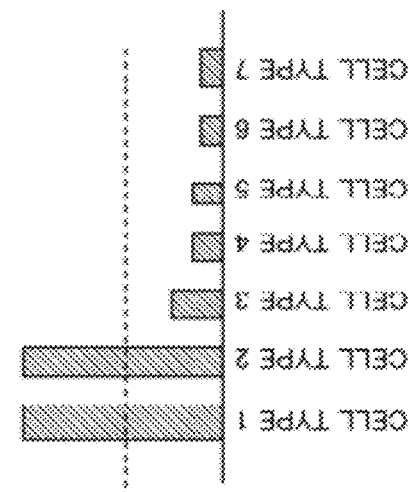
FIGS. 2A and 2B are diagrams depicting the number of explanatory variables when the results of analysis are incorrect and correct, respectively.

Hereinafter, description will now be made in relation to embodiment with reference to the accompanying drawings.

(1) Phenomenon Caused by Incorrectly Selecting Failure Candidates

As described above with reference to FIGS. 17 and 18, assuming that each failure element n has a number of failure candidates (e.g., nets or activated paths) including failure factors (layers or cell types) that causes a failure of each failure element n in failure analyzing, incorrect selection of the failure candidates results in a high possibility of not deriving correct result of the analysis. For example, in the error cause analysis, if a net containing a layer of the cause of an error is not correctly selected from the nets belonging to each group n, in other words, if nets regarded as failure candidates of each group n are incorrectly selected, the correct layer causing the failure may not be correctly estimated. In the meantime, if a path causing delay is not correctly selected as an activated path that reaches each FFn in the speed path analysis, in other words, if the activated path regarded as a failure candidate is incorrectly selected, the cause (e.g. a cell type) of the delay may not be correctly estimated.

If a correct result of the analysis are not obtained due to incorrect selection of failure candidates as the above cases, the following phenomena (I) and (II) appear in the result of the analysis.

(I) Lowering a Magnitude of Compatibility:

A magnitude of compatibility is a value related to a degree of coincidence between a result of analysis and a measured value. A magnitude of compatibility increases in accordance with increase in the degree of the coincidence while decreases in accordance with decrease in degree of the coincidence. If a correct analysis result is not obtained because failure candidates are not correctly selected, the degree of coincidence between the analysis result and the measured value is low, so that the magnitude of compatibility is small.

A specific compatibility when the function f(a1, a2, ..., aM) is derived through a regression analysis is exemplified by the following (I-1) through (I-2).

(I-1) The Inverse of the Sum Square of a Difference Between an Analysis Result and a Measured Value:

Specifically, the error $\epsilon'(n)$ serving as a result of analysis calculated on the basis of the function f(a1, a2, ..., aM) and the $\epsilon(n)$ of the measured result on the actual chip are derived. Then, the sum square $\Sigma(\epsilon'(n)-\epsilon(n))^2$ of the difference between these errors are calculated, and a value proportional to the inverse of the sum square $\Sigma(\epsilon'(n)-\epsilon(n))^2$ is used as the magnitude of compatibility. The value of the sum square $\Sigma(\epsilon'(n)-\epsilon(n))^2$ increases as the degree of coincidence between the analysis result and the measured value decreases due to incorrect selection of failure candidates while approaches zero as the degree of coincidence between the analysis result and the measured value increases due to correct selection of the failure candidates. Accordingly, a value proportional to the inverse of the sum square $\Sigma(\epsilon'(n)-\epsilon(n))^2$ can be used as an magnitude of compatibility.

(I-2) A Correlation Coefficient Between an Analysis Result and a Measured Value:

Specifically, the error $\epsilon'(n)$ serving as a result of analysis calculated on the basis of the function $f(a1, a2, \ldots, aM)$ and the $\epsilon(n)$ of the measured result on the actual chip are derived. Then, a correlation coefficient between the errors $\epsilon'(n)$ and $\epsilon(n)$ is calculated and used as the magnitude of compatibility. The correlation coefficient approaches one as the degree of coincidence between the analysis result and the measured value increases due to correct selection of failure candidates while approaches zero as the degree of coincidence between the analysis result and the measured value decreases due to correct selection of the failure candidates to reduce the correlation between the errors $\epsilon'(n)$ and $\epsilon(n)$. Accordingly, the correlation coefficient can be used as a magnitude of compatibility. Hereinafter, the correlation coefficient may sometimes be referred to as a "determination function".

(I-3) If the function $f(a1, a2, \ldots, aM)$ is derived through a machine learning and the result of the learning is applied to a supervising signal, the inverse of the number of elements that reply with wrong answers is used as the magnitude of compatibility. Specifically, the number of elements that reply with wrong answers increases as the degree of coincidence between the analysis result and the measured value decreases due to incorrect selection of failure candidates while decreases as the degree of coincidence between the analysis result and the measured value increases due to correct selection of the failure candidates. Accordingly, a value proportional to the inverse of the number of elements that reply with wrong answers can be used as a magnitude of compatibility.

Figure 2A:
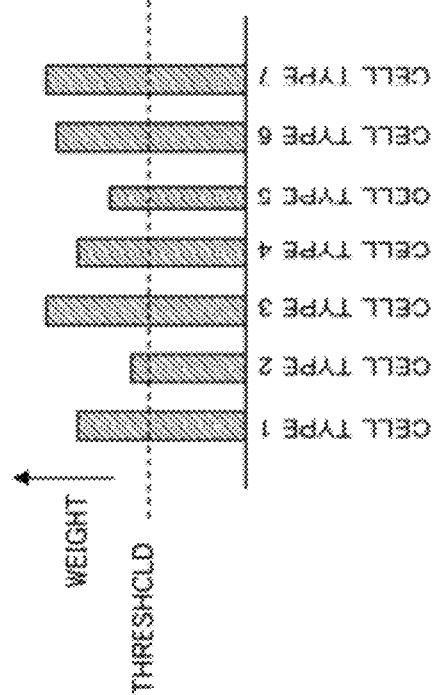
Figure 17:
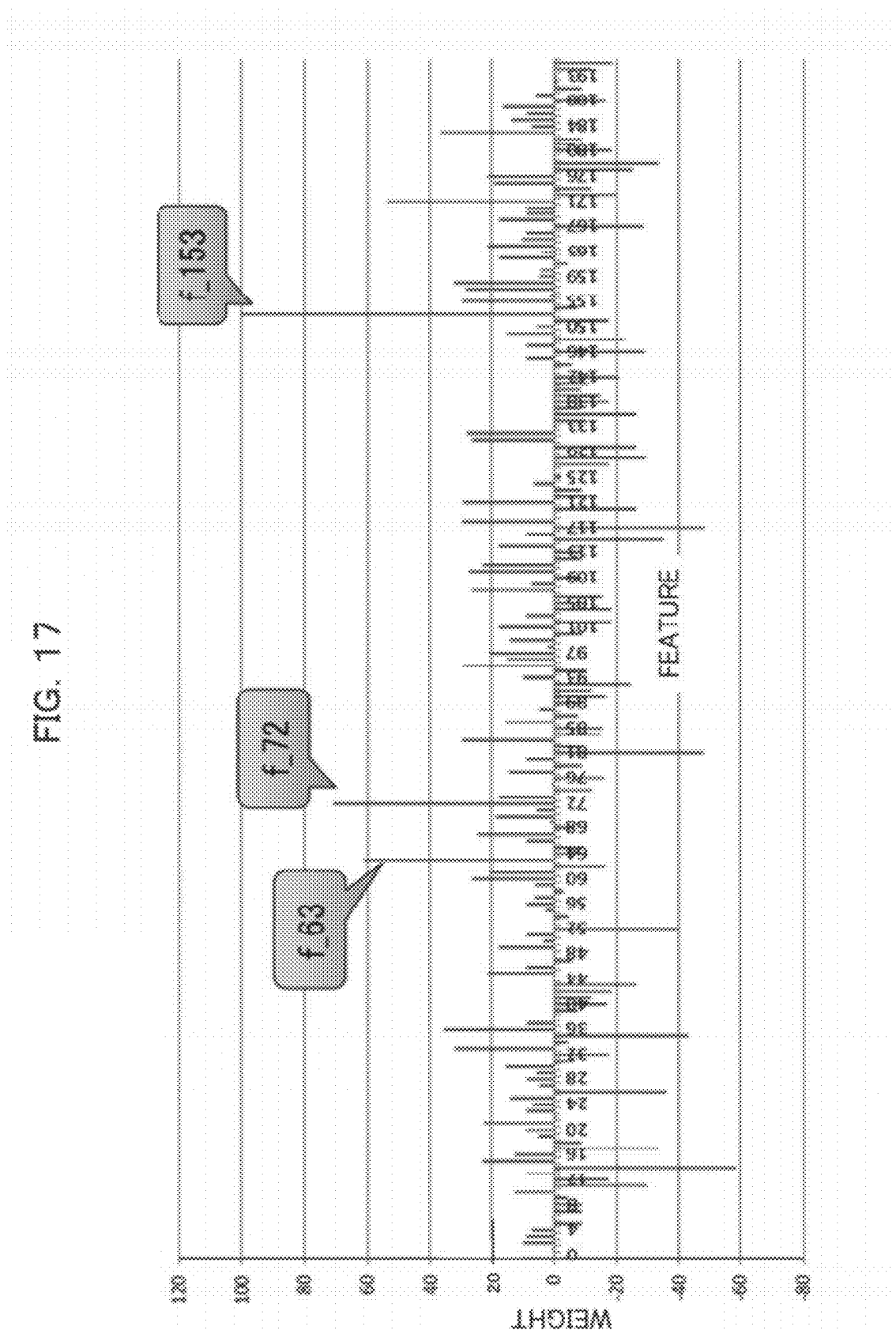
FIG. 17 is a diagram illustrating the result of analysis when failure candidates are correctly selected.
Figure 18:
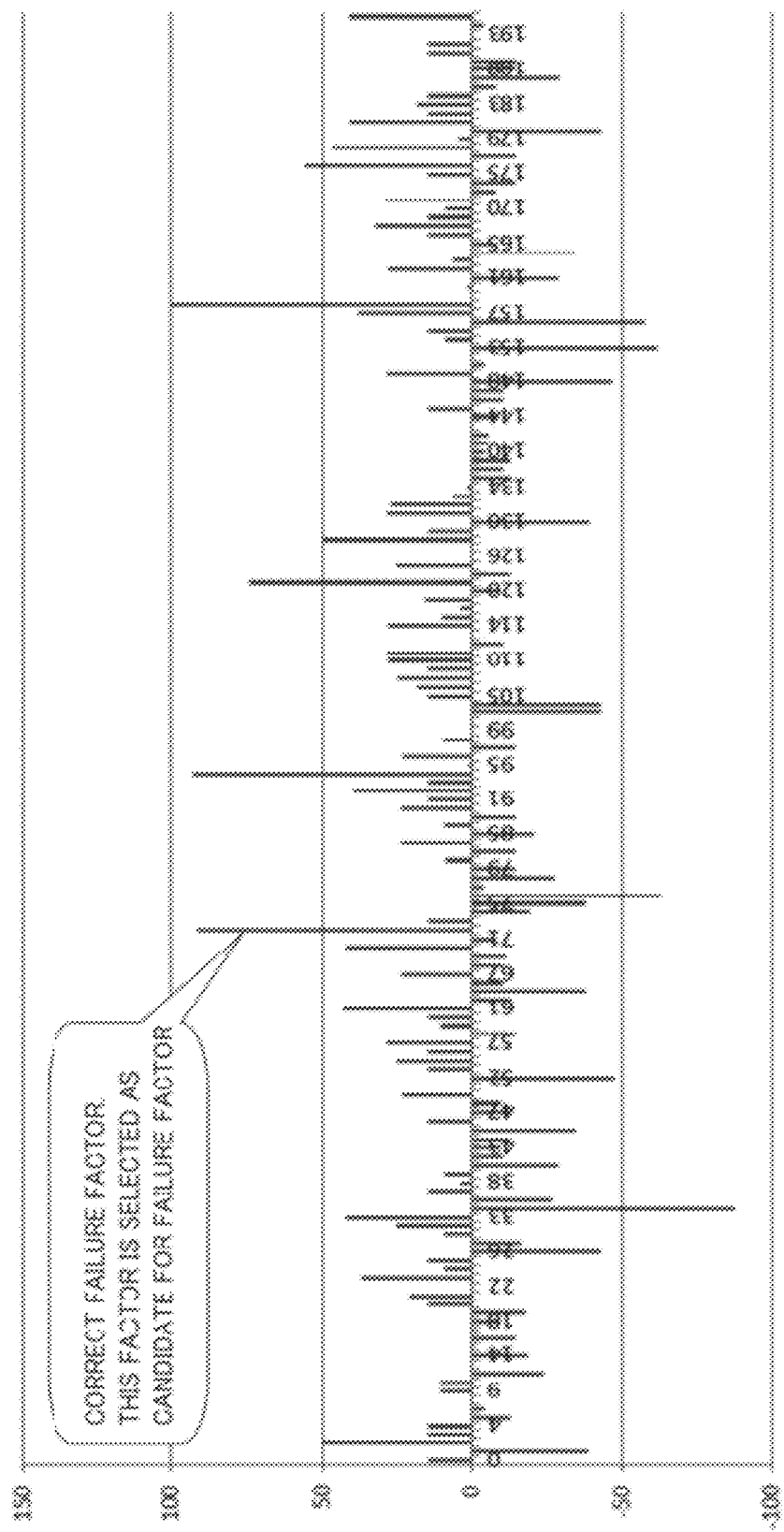
FIG. 18 is a diagram illustrating the result of analysis when failure candidates are incorrectly selected.

(II) Increase in Explanatory Variables:

An explanatory variable is an amount am of feature having a weight Xm of a constant value (threshold) or more among amounts a1-aM of feature of failure factors 1-M (e.g., layers and cell types) of a function $f(a1, a2, \ldots, aM)$ derived by a linear regression analysis. If a correct result of analysis is not derived due to incorrect selection of failure candidates, the weights of many failure factors (amounts of feature) not related to the failure factor of the failure in question are large to reason the presence of the incorrect failure candidates. For this, as illustrated in FIGS. 2A and 18, the number of explanatory variables greatly increases. On the other hand, if a correct result of analysis is derived due to correct selection of failure candidates, the function f can correctly express the failure, so that the weights of only the failure factors related to the failure are large. Consequently, as illustrated in FIGS. 2B and 17, the number of explanatory variables is two or three.

(2) Principle of Failure Analysis

The magnitude of compatibility and the number of explanatory variables described in the above (I) and (II) are used as costs when optimization, that is, determining the optimum combination of failure candidates is carried out as detailed below in the embodiment. Namely, if each failure element n has two or more failure candidates (activated paths, candidate regions) including one or more failure factors m (first failure factors) that cause failure of the element n, the following embodiments uses the magnitude of compatibility or the number of explanatory variables described in the above (I) or (II) as costs and thereby selects a combination of failure candidates that assigns a single correct failure candidate to each failure element n.

Hereinafter, for simplification, description will now be made assuming that the following embodiments carry out a speed path analysis as the failure analysis. In this description, an example of a failure element n is a flip flop n (hereinafter abbreviated to a FFn); an example of a failure factor m is a cell type m; and an example of a failure candidate is an activated path connected to a FFn. The following embodiment can also be applied to an error cause analysis in the same manner as a speed path analysis. In an error cause analysis, an example of a failure element is a group (partial circuit) n; an example of a failure factor m is a wiring layer m; and an example of a failure candidate is a candidate region in a group n.

Hereinafter, each of P failure elements (FF1-FFP) amount N failure elements (FF1-FFN, P≤N) is assumed to have a number of failure candidates (activated paths), and each FFi (i=1, 2, . . . , P) is assumed to be connected to $K_i$ activated paths. Accordingly, the total number of combination of failure candidates of P failure element is $K_1 \times K_2 \times \ldots \times K_P$. Here, a reference number $k_i$ ($k_i$=1, 2, . . . , $K_i$) represents one of $K_i$ activated paths connected to each FFn. The use of a reference number $k_i$ makes it possible to describe a combination of failure candidates that assigns failure candidates of the respective P failure elements in a vector $kv=(k_1, k_2, \ldots, k_P)$. When $k_i$=1, the first activated path is selected for a FFi; when $k_i$=2, the second activated path is selected for a FFi; and when $k_i$=$K_i$, the $K_i$-th activated path is selected for a FFi.

Figure 3:
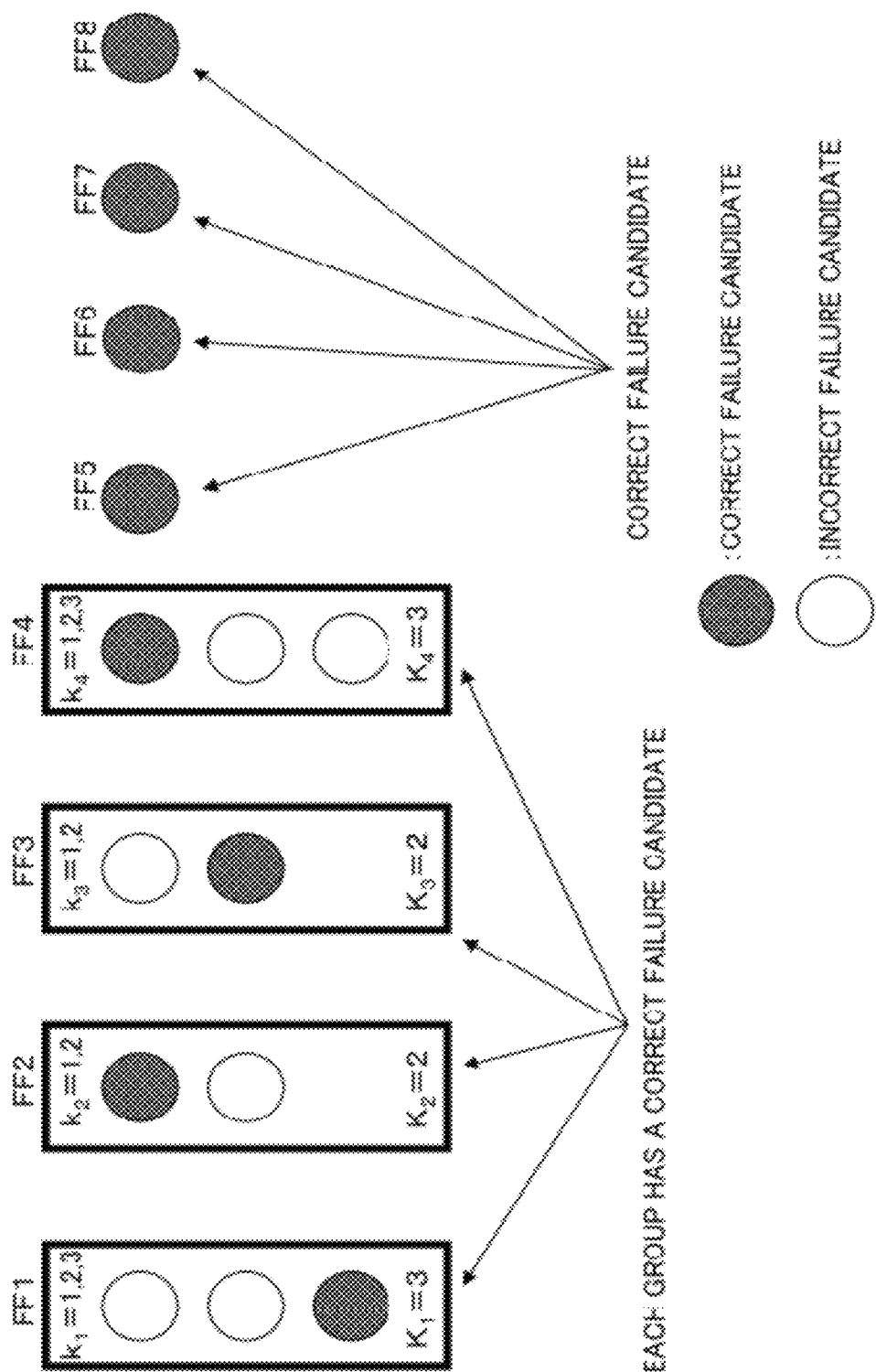
FIG. 3 is a diagram illustrating the principle of a failure analysis of the first embodiment.

Here, the principle of a failure analysis that the embodiments adopts, in particular, processing to determine an optimum combination of failure candidates in the embodiments, will now be described with reference to FIG. 3. In FIG. 3, circles represent failure candidates (activated paths). In particular, a hatched circle represents a correct failure candidate of a corresponding failure element FFn. Each failure element FFn has one correct failure candidate.

The example of FIG. 3 assumes N=8 and P=4. The failure element FF1 has three activated paths ($k_1$=1, 2, 3; $K_1$=3) serving as the failure candidates; the failure element FF2 has two activated paths ($k_2$=1, 2; $K_2$=2) as the failure candidates; the failure element FF3 has two activated paths ($k_3$=1, 2; $K_3$=2) as the failure candidates; and the failure element FF4 has three activated paths ($k_4$=1, 2, 3; $K_4$=3) as the failure candidates. The failure elements FF5-FF8 each have a single activated path as the failure candidates and are not objects to be included in a combination of failure candidates.

Accordingly, the example of FIG. 3 has 3×2×2×3=36 combinations of failure candidates (activated paths) for four failure elements FF1-FF4. In the present embodiments, the most suitable combination of the failure candidates is selected and determined among 36 combinations using costs based on the magnitude of compatibility or the explanatory variables. In FIG. 3, suitable failure candidates that are preferably selected are represented by the hatched circles, but are not practically grasped which failure candidates (i.e., represented by the hatched circles).

In the embodiments, the optimization of a combination kv of failure candidates is solved through the following formulating, so that failure factors can be precisely estimated. Under the presence of P combinations of failure candidates and $K_i$ failure candidates in the i-th combination (i=1, 2, . . . , P), the combination $kV_{best}=(k_{best1}, k_{best2}, \ldots, k_{bestP})$ of failure candidates which combination minimizes the cost $C(k_1, k_2, \ldots, k_P)$ ($k_j \leq K_j$; j=1, 2, . . . , P) is derived. An example of the cost C is the inverse of the magnitude of compatibility or the number of explanatory variables, and a combination kv of failure candidates that minimizes the inverse of the magnitude of compatibility or the number of explanatory variables is selected as the most suitable combination $kv_{best}$ of failure candidates.

Generally, although optimization of the combination is considered not to be solved because the number of combination increase exponentially, the most cases of failure analysis of the embodiments concern a few, e.g., two or three failure candidates that largely affect each failure element (FFs or groups). Namely, since the number of significant failure candidates of each failure element is limited to a few, the above optimization can be solved. If a general failure analysis performed in the above steps (i) through (iv) selects incorrect failure candidates for part of failure elements, failure factor can be estimated. Therefore, if the manner of the present embodiment can find a combination of failure candidates close to the optimum combination of failure candidates, correct failure factors can be estimated.

(3) Input Information and Output Information

Input information to be input for a failure analysis accomplished by solving an optimization problem of the combination of failure candidates as the above and output information to be output as a result of the failure analysis are follows.

(3-1) Input Information:

(1) the number $K_i$ (i=1, 2, ..., P) of failure candidates of each failure element i (the i-th combination):

(2) a delay error (or failure rate) $\epsilon(n, kv)$ between the estimated value at designing and the measured value on an actual chip of an element n when a combination kv of failure candidates is selected:

In the speed-path analysis, $\epsilon(n, kv)$ represents a delay error of a FFn when, for example, a combination kv of failure candidates is selected. In the error cause analysis, $\epsilon(n, kv)$ represents, for example, an error rate of a group (partial circuit) when a combination kv of failure candidates is selected. Here, assuming that an estimated value of an element n at designing is represented by $T_{design}(n)$; a measured value of a failure element n of the actual chip when the combination kv of failure candidates is selected is represented by $T_{product}(n, kv)$, the relationship of the following Formula (5) is established for each failure element n.

$$T_{product}(n) = T_{design}(n, kv) + \epsilon(n, kv) \qquad (5)$$

(3) The magnitude a(m, n, kv) of influence (an amount of feature) of the failure factor m of a failure element n when the combination kv of failure candidate is selected:

If the number of amounts a(m, n, kv) of influence is excessively large, data required to calculate all the amounts a(m, n, kv) are input.

In a speed path analysis, a(m, n, kv) is specifically a magnitude of influence of a cell type m on the FFn, that is, the number of cells of the cell type m being used, when the combination kv of failure candidates is selected. In the meantime, in an error cause analysis, a(m, n, kv) is specifically the magnitude of influence of an m-th wiring layer on a group (partial circuit) n, that is, the wiring length of the m-th wiring layer, when the combination kv of failure candidates is selected.

(3-2) Output Information:

(1) an optimum combination $kv_{best}$ of failure candidates that minimizes the cost C:

$$kV_{best} = (k_{best1}, k_{best2}, \ldots, k_{bestP})$$

(2) a function f that provides a correlation between a failure factor and an error (or an error rate) (n, $kv_{best}$) of each failure element n when the optimum combination $kv_{best}$ of failure candidates is selected (see the following element (6)).

$$\epsilon(n, kv_{best}) = f(a(1, n, kv_{best}), a(2, n, kv_{best}), \ldots, a(M, n, kv_{best})) \qquad (6)$$

(4) First Embodiment (4-1) The Configuration of Failure Analyzing Apparatus According to a First Embodiment:

FIG. 1 is a block diagram schematically illustrating the functional configuration of a failure analyzing apparatus 1 according to the first embodiment.

The failure analyzing apparatus 1 of FIG. 1 derives the optimum combination $kv_{best} = (k_{best1}, k_{best2}, \ldots, k_{bestP})$ of failure candidates which combination minimizes the cost C and the function f (see Formula (6) above) when the optimum combination $kv_{best}$ of failure candidates is selected on the basis of the result of measurement on the actual chip, and estimates the failure factor based on the derived function f.

The failure analyzing apparatus 1 is formed of a calculator, such as a general personal computer, includes a processor 10 and a memory 20, and further includes a machine interface (not illustrated) which is operated by the designer to input various kinds of information into the failure analyzing apparatus 1. The processor 10 is the CPU, and the memory 20 may be an internal memory device such as a Random Access Memory (RAM), a Read Only Memory (ROM), and a Hard Disk Drive (HDD), or may be an external memory device.

The processor 10 executes a failure analyzing programs and thereby functions as a generator 11, an analyzer 12, a cost calculator 13, and determinator 14 that are to be detailed below. The memory 20 stores the above failure analyzing program and stores the above input information (1) through (3) detailed in above item (3-1) beforehand. Specifically, the number $K_i$ (i=1, 2, ..., P) of failure candidates of each failure element i (the i-th element); the delay error (or error rate) $\epsilon(n, kv)$ of each failure element n when the combination kv of failure candidates is selected; and the magnitude a(m, n, kv) of influence when the combination kv of failure candidates is selected are stored in the memory 20. If the total number of magnitudes a(m, n, kv) of influence is excessively large, data required to calculate all the magnitudes a(m, n, kv) of influence is stored in the memory 20, and the processor 10 calculates one or more required magnitude a(m, n, kv) of influence based on the data stored in the memory 20.

The generator 11 generates, if each of P failure elements (FF1-FFP) has a number of failure candidates (activated paths), a combination kv of failure candidates that assigns the failure candidates for the activated path of each failure element FFi. At the start of the analysis, the generator 11 generates an initial value of the combination kv of failure candidates while after the start of the analysis, the generator 11 generates another combination kv of failure candidates through a greedy algorithm or a genetic algorithm that are to be detailed below.

The analyzer 12 derives the function f corresponding to the combination kv of failure candidates generated in the generator 11 along the steps (i) through (iii) of a general failure analysis detailed above.

The cost calculator 13 calculates the cost $C(k_1, k_2, \ldots, k_P)$ (=C(kv)) of the function f(kv) on the basis of the function f(kv) that the analyzer 12 derives on the basis of the combination kv of failure candidates. An example of cost C(kv) is the inverse of the magnitude of compatibility and the number of explanatory variables, to which the cost C(kv) is however not limited. Alternatively, the cost C(kv) may be any parameter that decreases as the magnitude of compatibility increases.

An example of the magnitude of compatibility is a value proportional to the inverse of the sum square $\Sigma(\epsilon'(n, kv)-\epsilon(n))^2$ of the difference between the error $\epsilon'(n, kv)$ calculated using the function f(kv) derived by the analyzer 12 and the error $\epsilon(n)$ of the measured value. Another example of the magnitude of compatibility is a correlation coefficient (determination coefficient between the error $\epsilon'(n, kv)$ calculated on the basis of the function f(kv) derived by the analyzer 12 and the error $\epsilon(n)$ of the measured value. When the analyzer 12 derives a function f(kv) through machine learning, an additional example of the magnitude of compatibility is a value proportional to the invert of "the number of elements that reply with wrong answers" detailed above.

As described in the above item (II), an explanatory variable is an amount am of feature having a weight of the constant value (threshold) or more among amounts a1-aM of feature of the respective failure factors 1-M (e.g., cell type m, layer m) of a function f(kv) that the analyzer 12 derives through a linear regression analysis. The number of amounts am of feature of the threshold or more can be used as a cost C(kv).

The determinator 14 determines a combination $kv_{best}=(k_{best1}, k_{best2}, \ldots, k_{bestP})$ of failure candidates which combination minimizes a cost C(kv) derived by the cost calculator 13 among the combinations kv of failure candidates that the generator 11 generates. The combination $kv_{best}$ of failure candidates determined by the determinator 14 and the function $f(kv_{best})$ used when the same combination $kV_{best}$ of failure candidates is selected are output. The processor 10 estimates a factor of failure based on the form of the function $f(kv_{best})$ in the same manner as the above step (iv) of a general failure analysis.

Here, the generator 11 generates another combination kv of failure candidates along the following scheme (A1) or (A2).

(A1) the generator 11 uses function f(kv) derived by the analyzer 12 to calculate a provisional cost C(kv') of a function f(kv') derived by replacing each failure candidates of the combination kv of the failure candidates when the function (kv) is derived with another failure candidate. The term kv' represents a combination in which one of failure candidates in the combination kv is replaced with another failure candidate. Then the generator 11 generates the combination kv' of failure candidates that most reduces the provisional cost C(kv') (that is, kv' of failure candidates related to a minimum provisional cost C(kv')) as another combination of failure candidates, that is, a new combination kv of failure candidates. At that time, the generator 11 calculates the inverse of a magnitude of compatibility as a provisional cost C(kv'). An example of the magnitude of compatibility, when the provisional cost C(kv') is to be calculated, can be a value proportional to the inverse of the sum square $\Sigma(\epsilon'(n,kv')-\epsilon(n))^2$ of the difference between the error $\epsilon'(n,kv')$ calculated on the basis of the function f(kv') derived by the analyzer 12 and the error $\epsilon(n)$ based on the measured value. Another example of the magnitude of compatibility to calculate the provisional cost C(kv') is a correlation coefficient (determination coefficient) between the error $\epsilon'(n,kv')$ calculated on the basis of the function f(kv') derived by the analyzer 12 and the error $\epsilon(n)$ based on the measured value. The above method of generating new combinations kv' of failure candidates by replacing each of the failure candidates in the combination kv with another failure candidate of the same element and regarding one of the new combinations kv' that minimizes the provisional cost C(kv') as the new combination kv of failure candidates is called greedy algorithm. A detailed manner of generating a new combination and a specific example of a greedy algorithm will be described below with reference to FIGS. 6, and 8-10.

(A2) The generator 11 regards combinations $kv=(k_2, k_2, \ldots, k_P)$ of failure candidates as genes and generates the combinations kv through a genetic algorithm. In this case, a number of combinations of failure candidates assigned by the user are prepared as genes beforehand. On the basis of the prepared combinations of failure candidates, a selection of two of the prepared combination or a mutation is made for each generation. Combinations of failure candidates generated by selection and mutation of each generation are output as the result of generating by the generator 11.

(4-2) Operation of the Failure Analyzing Apparatus of the First Embodiment:

Next, description will now be made in relation to specific operation of the failure analyzing apparatus 1 with reference to FIGS. 4-10.

(4-2-1) Analysis:

The analysis operation of the failure analyzing apparatus 1 is detailed with reference to a flow diagram (steps S1-S8) of FIG. 4.

First of all, the input information (1)-(3) described above item (3-1) is read from the memory 20 and input into the processor 10 (step S1). Specifically, information of $K_1 \times K_2 \times \ldots \times K_P$ combinations of failure candidates (the number of failure candidates $K_i$ (i=1, 2, $\ldots$, P)), and a list associating delay errors (or failure rates) $\epsilon(n, kv)$ with amounts a(m, n, kv) of feature are read and input into the processor 10.

In the processor 10, the generator 11 generates the initial value of the combination kv of failure candidates and sets the maximum value $\infty$ for the initial value of the minimum cost $C_{best}$ (step S2). The initial value of the combination kv of failure candidates may be a combination of random values $(k_1, k_2, \ldots, k_P)$ that satisfy, for example, the relationship $k_j \geq K_j$ or a combination $(1, 1, \ldots, 1)$ that assigns the first candidate of each of the P failure candidate. When a genetic algorithm is adopted, the initial value of the combination of failure candidates may be the combination of the first-generation genes.

Upon the initial value is set, the cost C(kv) for the combination kv of the failure candidate generated by the generator 11 is calculated (step S3). The procedure of the calculating the cost C(kv) of FIG. 3 will be detailed below with reference to FIG. 5.

After the cost C(kv) is calculated, the determinator 14 compares the calculated cost C(kv) and a current minimum cost value $C_{best}$ (step S4). If the result of the comparison is $C_{best} > C$ (YES route in step S4), the current minimum cost $C_{best}$ is replaced with the latest calculated cost C(kv), so that the combination kv of failure combination is replaced the optimum combination (optimum solution) $kv_{best}$ (step S5).

After the minimum cost $C_{best}$ and the optimum combination $kv_{best}$ are replaced, the determinator 14 determines whether a loop termination condition is satisfied (step S6). The loop termination condition is that, if a greedy algorithm is adopted in step S7, a combination of failure candidates that would be corresponding to the minimum cost $C_{best}$ is not left any more while, if a genetic algorithm is adopted, the number of generations already processed reaches a predetermined number or the optimum solution $kv_{best}$ is not rewritten for a longer time than a predetermined period of time.

If the loop termination condition is not satisfied (NO route in step S6), the generator 11 generates another combination kv of failure candidates through the greedy algorithm or the genetic algorithm (step S7), and the new combination kv of failure candidates then undergoes the processes of steps S3-S6. The procedure of generating another combination kv of failure candidates (through a greedy algorithm) in step S7 will be detailed below with reference to FIG. 6.

On the other hand, if the result of the comparison in step S4 is $C_{best} \leq C$ (NO route), step S5 is skipped and step S6 is carried out.

Then, if the loop termination condition is determined to be satisfied in step S6 (YES route), the determinator 14 outputs the current optimum combination $kv_{best}$ and the function $f(kv_{best})$ used when the current optimum combination $kv_{best}$ is selected (step S8). The processor 10 estimates a failure factor from the form of the function f ($kv_{best}$) in the same manner as the step (iv) of the above general failure analysis.

(4-2-2) Operation of Calculating a Cost:

An operation (detailed processing of step S3 of FIG. 4) of calculating a cost in the failure analyzing apparatus 1 will now be described with reference to a flowchart (steps S10-S14) of FIG. 5.

Upon the generator 11 (step S2 or step S7) derives a combination kv of failure candidates (step S10), an error $\epsilon(n, kv)$ and an amount a(m, n, kv) of feature when the combination kv of failure candidates is selected are derived for each n=1–N and m=1–M (step S11). At that time, errors $\epsilon(n, kv)$ and amounts a(m, n, kv) of feature are read from the memory 20 or calculated on the basis of data stored in the memory 20.

After errors $\epsilon(n, kv)$ and amounts a(m, n, kv) of feature are derived, the analysis 12 derives a function f (kv) corresponding to the combination kv of failure candidates along the steps (i)-(iii) of the above general failure analysis (step S12).

Upon the function f(kv) is derived, the cost calculator 13 calculates a cost C(kv) of the function f(kv) on the basis of the function f(kv) (step S13). Examples of the cost C(kv) is the inverse of the magnitude of compatibility or the number of explanatory variable as detailed above. After the cost C(kv) is calculated and output, the step S4 and the subsequent steps in FIG. 4 are carried out on the cost C(kv).

(4-2-3) Operation of Generating a Combination of Failure Candidates:

With reference to the flowchart (steps S20-S25) of FIG. 6, description will now be made in relation to operation (detailed processing of step S7 of FIG. 4) of generating a combination kv of failure candidates in the failure analyzing apparatus 1. The procedure of FIG. 6 assumes that the generator 11 generates a combination kv of failure candidates through a greedy algorithm.

Figure 4:
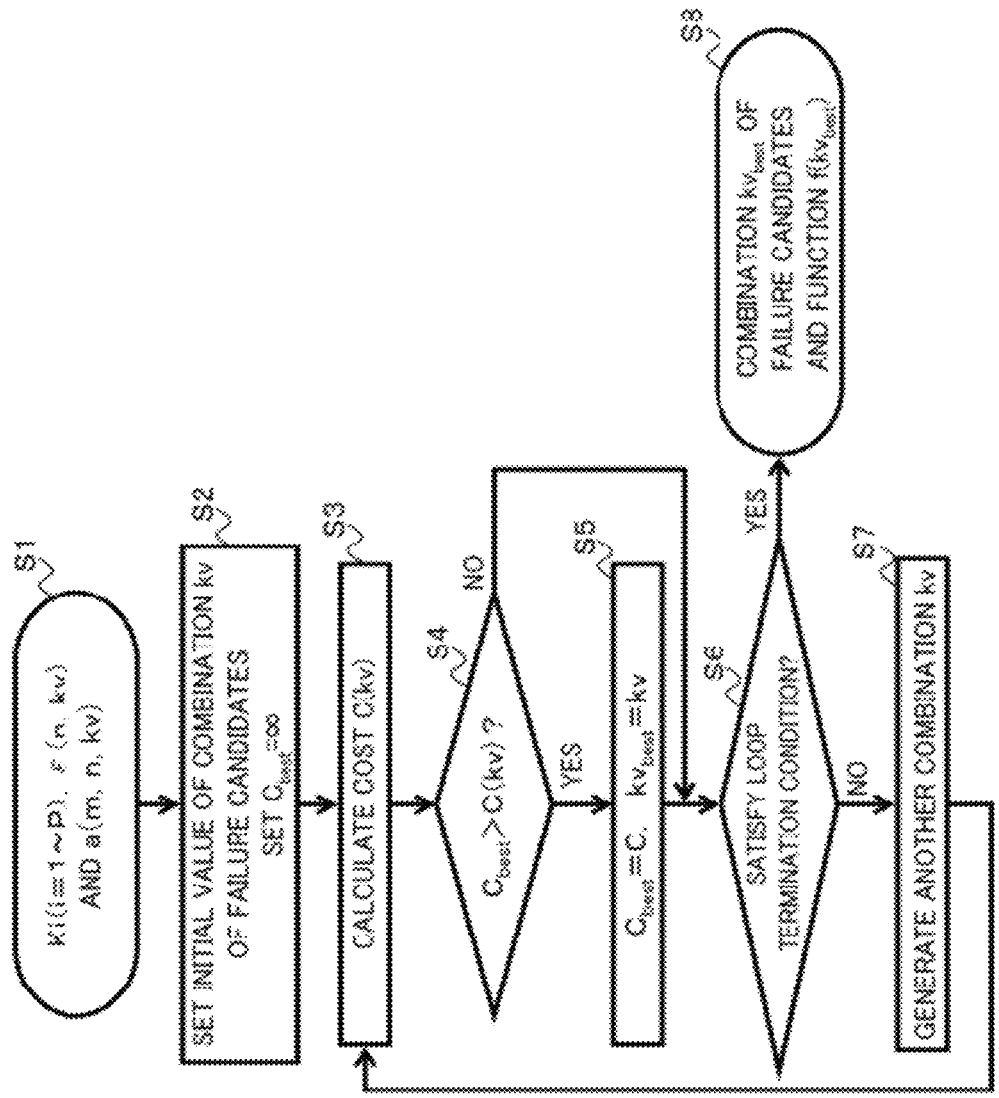
FIG. 4 is a flow diagram illustrating a succession of procedural steps of analysis performed by the failure analyzing apparatus of the first embodiment.

If the loop termination condition is determined not to be satisfied in step S6 of FIG. 4, a current combination kv of failure candidate the most recently generated is input into the generator 11 (step S20) and a next new combination kv of failure candidates are generated in steps S21-S25. First, a combination kv' of failure candidates is generated by replacing one of the failure candidates in the current combination kv=$(k_2, k_2, \ldots, k_P)$ with another candidate (step S21). The combination kv' has a candidate $k_x'$ replaced by the candidate $k_x$.

Upon the combination kv' is generated, the generator 11 calculates a provisional cost C(kv') related to the combination kv' on the basis of the function f(kv) derived in step S12 of FIG. 5 (step S22). The calculated cost C(kv') is stored in the memory 20 in association with the combination kv' (step S23). As described above, the provisional cost C(kv') is, for example, the inverse of the magnitude of compatibility.

Next, the generator 11 determines whether all the failure candidates to be replaced undergo the processing of steps S21-S23 (step S24). If all the failure candidates do not undergo the processing of steps S21-S23 (NO route of step S24), the processing of steps S21-S23 are repeated on failure factors that are not processed.

If all the failure candidates undergo the processing of steps S21-S23 (YES route of step S24), the generator 11 selects one combination that reduces the provisional cost C(kv') the most (that is, one combination related to the smallest provisional cost C(kv')) among all the combinations kv' of failure candidates replaced and stored in the memory 20 as the new combination kv of failure candidates (step S25). Upon selection of the new combination kv of failure candidates, the processing of step S3 and the subsequent steps of FIG. 4 is performed on the new combination kv of failure candidates.

In step S25, two or more combinations kv' of failure candidates reduces the provisional cost C(kv') the most, one of the two or more combinations kv' in question is randomly selected as the new combination kv of failure candidates.

A failure candidate that is previously replaced in a combination kv' of failure candidates that is selected as the combination kv' that reduces the provisional cost C(kv') the most is excluded from a failure candidate to be replaced in step S21, that is, is excluded from the determination of step S24.

If the generator 11 adopts a genetic algorithm to generate a combination kv of failure candidates in step S7 of FIG. 4, the generator 11 uses two or more combinations of failure candidates prepared by the user as genes and makes selection or mutation on two of the combinations of failure candidates for each generation. A combination of failure candidates generated by selection or mutation in each generation is selected as the new combination kv of failure candidates, which then undergoes the processing of step S3 and the subsequent steps of FIG. 4.

(4-2-4) Effects:

According to the failure analyzing apparatus 1 of the first embodiment, the combination $kv_{best}$ of failure candidates that minimizes the cost C(kv) that is derived by the cost calculator 13 is selected among the combinations kv of failure candidates generated by the generator 11, and outputs the function $f(kv_{best})$ related to the selection of the combination $kv_{best}$ of failure candidates is output. Then the failure factor is estimated from the form of the function $f(kv_{best})$. Consequently, selection of the optimum combination $kv_{best}$ makes it possible to precisely estimate the failure factor based on the failure factor is precisely estimated on the basis of the function $f(kv_{best})$ derived on the basis of the optimum combination $kv_{best}$ of failure candidates.

Figure 7A:
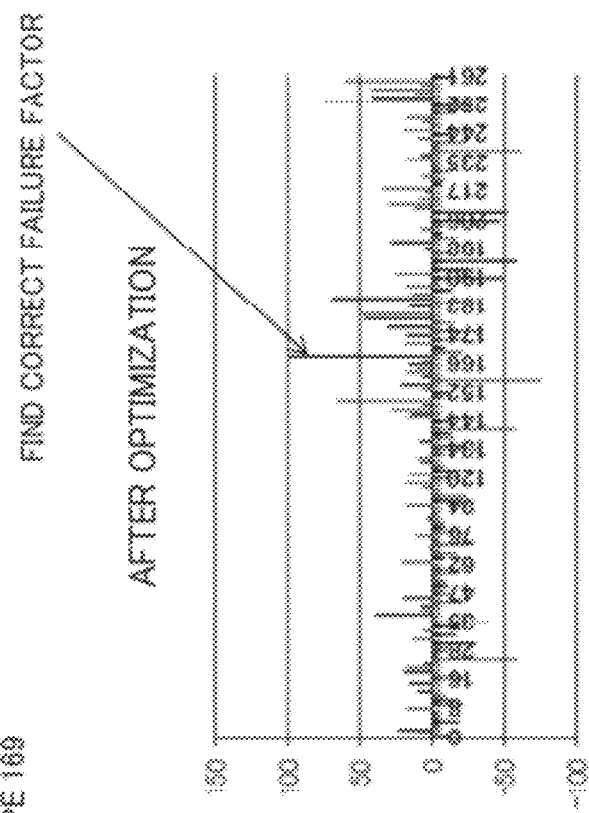
FIGS. 7A and 7B are diagrams illustrating the results of analysis performed before and after the optimization of the first embodiment.
Figure 7B:
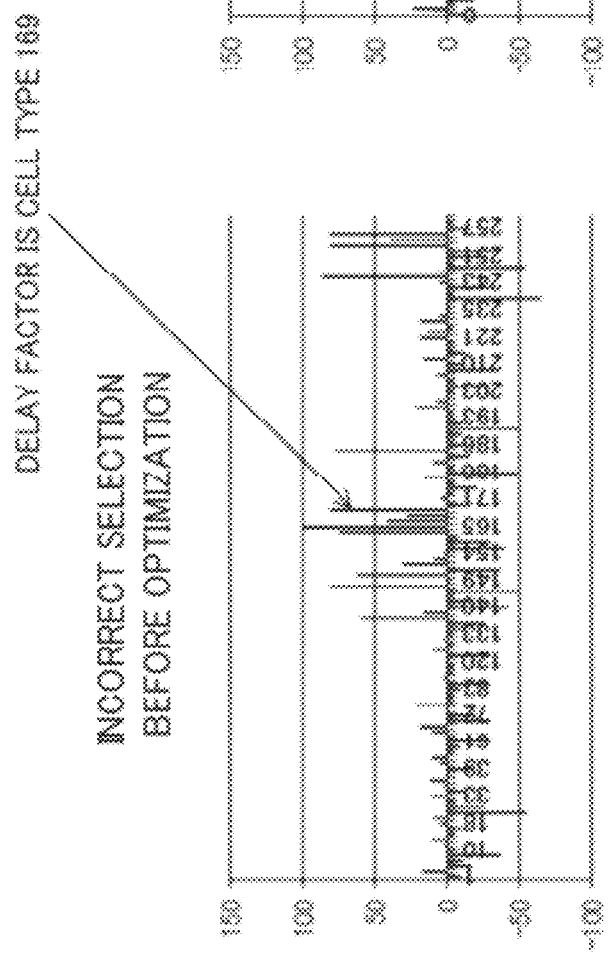
Figure 15:
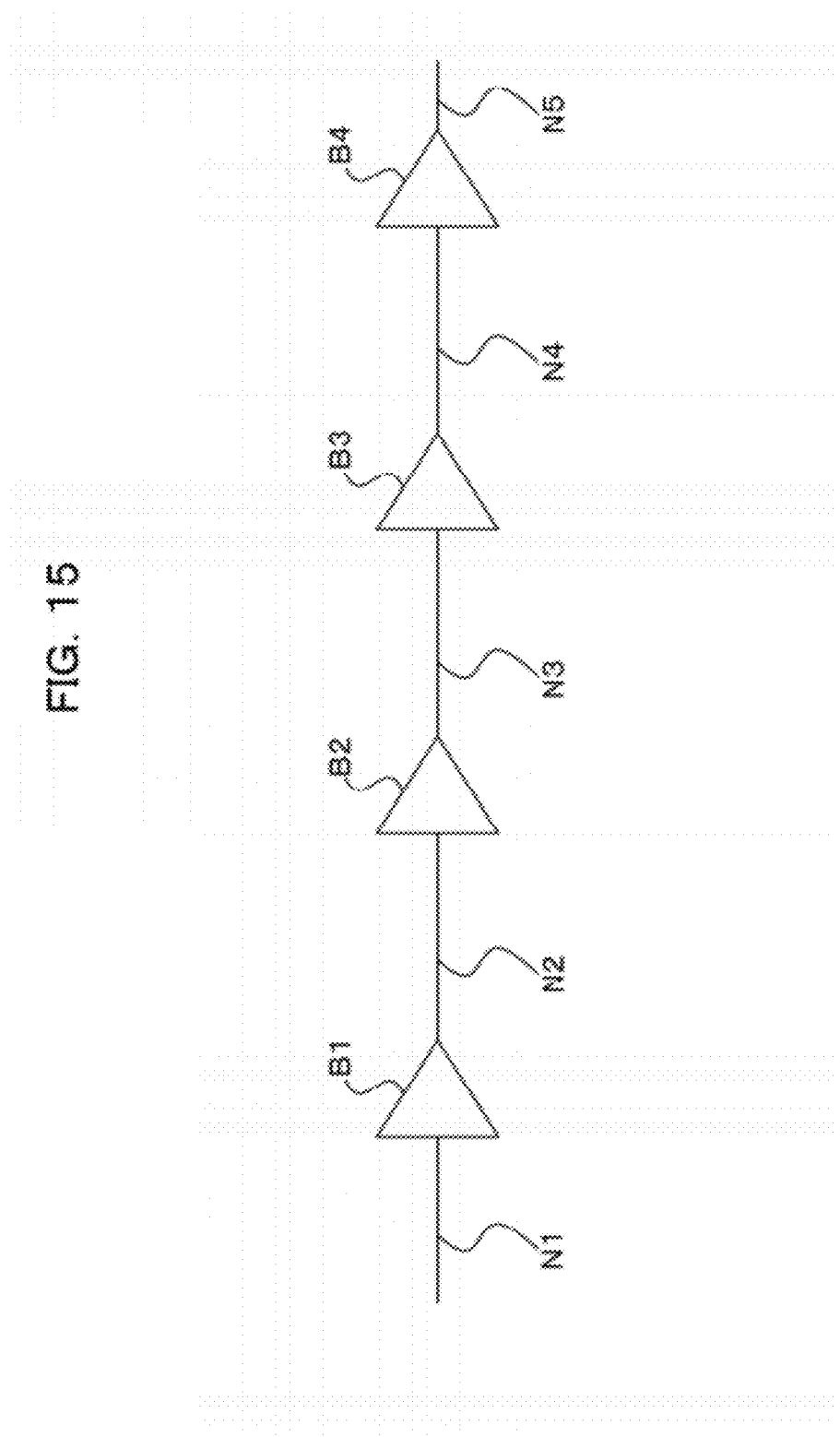
FIG. 15 is a diagram explaining problems of the error cause analysis.
Figure 16:
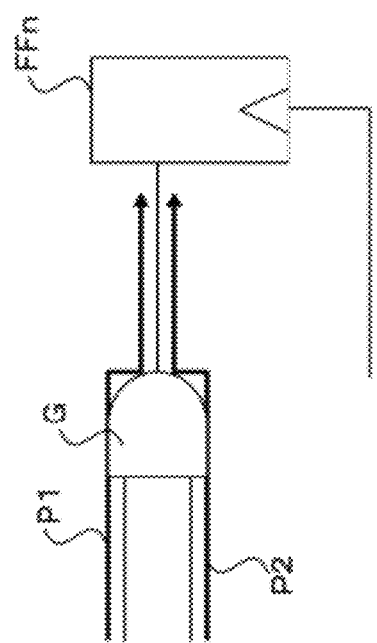
FIG. 16 is a diagram explaining problems of the speed path analysis.

Here, FIGS. 7A and 7B depict results of analysis performed before and after the optimization of the first embodiment.

FIG. 7A depicts an example of a result of a speed path analysis when a selected combination of failure candidates is not correct. In FIG. 7A, since the absolute values of a number of weights exceed the constant value (threshold) likewise the examples of FIGS. 2A and 18, the cell type (169) being the correct factor of delay failure is specified as the factor of the delay failure, so that there is a possibility of deriving a wrong result of the analysis.

On the other hand, FIG. 7B depicts an example of a speed path analysis in which a greedy algorithm is adopted and an optimum combination of failure candidates is selected using the inverse of the magnitude of compatibility (i.e., the inverse of a sum square of the difference between the value of analyzed result and the measured value). In FIG. 7B, the absolute value of a weight of only the cell type (169) being the correct factor of delay failure exceeds the constant value (i.e., threshold), so that the correct cell type (169) can be estimated to be the factor of the delay failure and a correct result of the analysis can be derived.

(4-2-5) Specific Example of Analysis:

Next, description will now be made in relation to a simple specific example of analysis performed by the failure analyzing apparatus 1 with reference to FIGS. 8-10. The example of FIGS. 8-10 assumes that a speed path analysis is carried out on FFs being failure elements.

The example of a circuit depicted in FIGS. 8-10 includes cells of three cell types x, y, and A that have a possibility of being failure factors, and 103 FFs (FF1-FF103) serving as output-end registers. One or two activated paths including cells of three cell types x, y, and A reach each of the FF1-FF103 and are regarded as failure candidates. Hereinafter, cells belonging to the cell types x, y, and A are simply called cells x, y, and A, respectively.

Here, the description assumes the delay value of a single cell A is 40 ps estimated at designing and is increased to 100 ps measured on a manufactured actual chip while the delay values of a single cell x and a single cell y estimated at designing and measured on the manufactured actual chip are both 50 ps. The delay value of each cell is estimated at the designing and is therefore known, but the delay value of each cell mounted on a manufactured actual chip is not seen from the designer. In the example of the circuit of FIGS. 8-10, the cell A has a large difference between the delay values at designing and after manufacturing the actual chip, which causes a delay failure. Namely, the cell A is the failure factor. Hereinafter, description is made in relation to a flow of analysis by the failure analyzing apparatus 1 to specify the cell A as the failure factor on the example of the circuit of FIGS. 8-10.

As depicted in FIG. 8, two activated paths, one of which passes through the cells A and x and the other of which passes through the cells y and x, reach each of the FF1-FF100. In the speed path analysis, one of the two activated path is selected as a path n (n=1, 2, . . . , 100) of the failure candidate. The path that reaches a FF through the cells A and x has a delay value estimated at designing of 40+50=90 ps while the path that reaches a FF through the cells y and x has a delay value estimated at designing of 50+50=100 ps. For the above, at the start of the analysis, the slowest path, that is a path (passing through the cells y and x) having a delay value of the maximum value 100 ps, is selected as the failure candidate from the two activated paths. However, since the cell A actually has a large error between the delay value estimated at designing and after manufacturing the actual chip, which causes the delay failure, selection of the path passing through the cells y and x would be not correct, but selection of the path passing through the cells A and x would be correct. The failure analyzing apparatus 1 selects a combination kv of failure candidates that minimizes the cost (i.e., the inverse of magnitude of compatibility) and thereby optimizes the selection of a path, that is, a state of selecting an incorrect path is changed to a state of selecting a correct path. Measured delay values of the respective paths that reach the FF1-FF100 are 150 ps.

Two activated paths both of which pass through the cells A and x reach the FF101, and selecting either path makes the estimated delay value at designing is 40+50=90 ps. For the above, only a single type of path substantially reaches the FF101 and the path that passes through the cells A and x is selected as the path 101 being a failure candidate, so that the FF101 is not to be selected for a combination kv of failure candidates. The path 101 that reaches the FF 101 has a measured delay value of 150 ps.

Similarly, two activated path both of which pass through the cells y and x reach the FF102, and selecting either path results in the estimated delay value at designing being 50+50=100 ps. For the above, only a single type of path substantially reaches the FF102 and the path that passes through the cells y and x is selected as the path 102 being a failure candidate, so that the FF102 is not to be selected for a combination kv of failure candidates. The path 102 that reaches the FF 102 has a measured delay value of 100 ps.

A single activated path that passes through the cell y reaches the FF103. The path passing through the cell y is selected as the path 103 being a failure candidate, so that the FF103 is not to be selected for a combination kv of failure candidates. The path 103 that reaches the FF 103 has a measured delay value of 50 ps.

In the example of the circuit depicted in FIGS. 8-10, the number N of failure elements is N=103; the number P of combinations of failure candidates is P=100; the number M of failure factors M=3, the number $K_1 = K_2 = \ldots = K_{100}$ of failure candidates for each combination is $K_1 = K_2 = \ldots = K_{100} = 2$; and a combination kv of failure candidates is kv=$(k_1, k_2, \ldots, k_{100})$. Here, the respective elements $k_i$ (i=1, 2, . . . , 100) in the combination kv of failure candidates are set to be "0" and "1" respectively when, for example, the path passing through the cells A and x is selected and the path passing through the cells y and x is selected, the elements $k_i$ in the combination kv of failure candidates are all set to "1" at the start of the analysis on the circuit of the example of FIG. 8. Specifically, at the start of the analysis on the circuit example depicted in FIG. 8, the generator 11 generates and outputs the first combination kv=(1, 1, . . . , 1) of failure candidates.

On the example of the circuit depicted in FIG. 8, that is, on the circuit for which a combination kv=(1, 1, . . . , 1) of failure candidates is selected, the analyzer 12 carries out a linear regression analysis to derive a function f that provides a correlation of error $\epsilon(n)$ between three cells x, y, and A and an error $\epsilon(n)$ of each FFn (path n=1, 2, . . . , 103). Along the above procedure, a system of simultaneous quotations depicted in FIG. 9 and represented by the following Formulae (7-1) through (7-103) is derived. The analyzer 12 solves the Formulae (7-1) through (7-103) through a linear regression analysis to calculate the weights X(x), X(y), and X(A) of three cell types x, y, and A, respectively and derive the function f. In the following Formulae, amounts of feature to be multiplied with the weights X(x), X(y), and X(A) correspond to magnitudes of influence of the cell type m on each FFn (path n), and is the number of cells x, that of cell y, and that of cells A that are used in each path n, respectively, in this embodiment.

$$\epsilon(1) = 150 - 100 = \qquad (7\text{-}1)$$
$$50 \text{ ps} = X(y) \times 1 + X(x) \times 1 + X(A) \times 0 \rightarrow 50 = X(y) + X(x)$$

$$\epsilon(2) = 150 - 100 = \qquad (7\text{-}2)$$
$$50 \text{ ps} = X(y) \times 1 + X(x) \times 1 + X(A) \times 0 \rightarrow 50 = X(y) + X(x)$$

$$\vdots \qquad \qquad \vdots$$

$$\epsilon(100) = 150 - 100 = \qquad (7\text{-}100)$$
$$50 \text{ ps} = X(y) \times 1 + X(x) \times 1 + X(A) \times 0 \rightarrow 50 = X(y) + X(x)$$

$$\epsilon(101) = 150 - 90 = \qquad (7\text{-}101)$$
$$60 \text{ ps} = X(y) \times 0 + X(x) \times 1 + X(A) \times 1 \rightarrow 60 = X(A) + X(x)$$

$$\epsilon(102) = 100 - 100 = \qquad (7\text{-}102)$$
$$0 \text{ ps} = X(y) \times 1 + X(x) \times 1 + X(A) \times 0 \rightarrow 0 = X(y) + X(x)$$

-continued $$\varepsilon(103) = \quad (7\text{-}103)$$
$$50 - 50 = 0 \text{ ps} = X(y) \times 1 + X(x) \times 0 + X(A) \times 0 \to 0 = X(y)$$

When the system of simultaneous quotations (7-1) through (7-103) is solved through a linear regression analysis (method of least square), the following values are derived as the weights X (x), X (y), and X(A).

$$X(x){=}49.50495, X(y){=}{-}2.3{\times}10^{-14}, X(A){=}10.49505$$

Accordingly, when the number of cells x being used, and those of cells y and cells A are represented by Nx, Ny, and NA, respectively, the function f that provides a correlation between three cells x, y, and A and an error $\epsilon(n)$ of each FFn is represented by the following Formula (8).

$$f(Nx, Ny, NA){=}49.50495{\times}Nx{-}2.3{\times}10^{14}{\times}Ny{+}10.49505{\times}NA \quad (8)$$

The above processing corresponds to part of steps S10-S12 of FIG. 5 and step S3 of FIG. 3.

Then the cost calculator 13 calculates the cost C(kv) based on the function f(kv) that is derived from the above Formula (8) assuming that the combination kv=(1, 1, . . . , 1) of failure candidates is selected. In this calculation, the cost calculator 13 first calculates the error $\epsilon'(n, kv)$ on each FFn (path n) on the basis of the function f(kv) of the above Formula (8). All the errors $\epsilon'(n, kv)$ on the FF1-FF100 (paths 1-100) based on the above Formula (8) are the same value 49.50495 from the following calculation.

$$\epsilon'(n,kv){=}49.50495{\times}1{-}2.3{\times}10^{-14}{\times}1{\approx}49.50495{<}\epsilon(n){=}50(n{=}1,2,\ldots,100)$$

The error $\epsilon'(\mathbf{101},kv)$ of the FF101 (path 101) based on the above Formula (8) is $\epsilon'(\mathbf{101},kv){=}49.50495{\times}1{+}10.49505{\times}1{=}60{=}\epsilon(\mathbf{101})$.

The error $\epsilon'(\mathbf{102},kv)$ of the FF102 (path 102) based on the above Formula (8) is $$\epsilon'(102,kv){=}49.50495{\times}1{-}2.3{\times}10^{-14}{\times}1{\approx}49.50495{>}\epsilon(102){=}0.$$

The error $\epsilon'(\mathbf{103},kv)$ of the FF103 (path 103) based on the above Formula (8) is $$\epsilon'(103,kv){=}{-}2.3{\times}10^{-14}{\times}1{\approx}0{=}\epsilon(103).$$

The cost calculator 13 calculates the cost based on the error $\epsilon'(n, kv)$ (n=1, 2, . . . , 103) calculated from the function f of Formula (8) and the error $\epsilon(n)$ derived from the estimated and measured values. Here, the inverse of the magnitude of compatibility is regarded as a cost. As a magnitude of compatibility, a correlation coefficient (determination coefficient) 0.99023956 between the errors $\epsilon'(n, kv)$ and $\epsilon(n)$ is calculated. If the errors $\epsilon'(n, kv)$ and $\epsilon(n)$ match, the determination coefficient is the maximum value of 1 and the cost is the minimum value of 1. However, as the error $\epsilon'(n, kv)$ less correlates with the error $\epsilon(n)$, the determination coefficient comes to be less than 1 and the cost comes to be larger than 1. In the above example, the determination coefficient of 0.99023956 makes the cost 1/0.990239561.009856645. The above Formula (7-102) for the FF 102 (path 102) contradicts the above Formulae (7-1) through (7-100), which is a factor to reduce the magnitude of compatibility (i.e., determination coefficient).

The above processing corresponds to part of steps S13 and S14 of FIG. 5, and step S3 of FIG. 3.

Next, the generator 11 carries out processing corresponding to step S7 of FIG. 3 (steps S20-S25 of FIG. 6), that is, the processing through a greedy algorithm. Namely, for each FFn (each path n), another unselected failure candidate (activated path) is selected and is used for calculation of a provisional cost. Then, a combination of failure candidates that reduces the provisional cost most (that is, a combination of failure candidates related to the minimum provisional cost) is selected as the next combination kv of failure candidates.

In detail, a combination kv' of failure candidates is generated by replacing one of the failure candidates in the current combination kv=(1, 1, . . . , 1, 1) with another candidate (step S21 of FIG. 6). In the circuit example of FIG. 10, the activated path passing through the cells y and x is currently selected for the FF100 (path 100), and by replacing the activated path currently selected with another activated path passing through the cells A and x, the combination kv'=(1, 1, . . . , 1, 0) of failure candidates is generated.

After the combination kv'=(1, 1, . . . , 1, 0) is generated, the corresponding provisional cost C(kv') is calculated on the basis of the function f of the above Formula (8) related to the combination kv=(1, 1, . . . , 1, 1). In the example of FIG. 10, after the failure candidates of only the FF 101 is changed from 1 to 0, the error $\epsilon'(100, kv')$ calculated by the Formula (8) is $$\epsilon'(100,kv'){=}X(A){\times}1{+}X(x){\times}1{=}49.50495{\times}1{+}10.49505{\times}1{=}60.$$

Since the error $\epsilon(\mathbf{100})$ based on the result of the measurement is also $\epsilon(\mathbf{100}){=}60$, the errors $\epsilon'(\mathbf{100},kv')$ and $\epsilon(\mathbf{100})$ match. Since the errors $\epsilon(\mathbf{100},kv)$ and $\epsilon(\mathbf{100})$ before the replacement are $\epsilon(\mathbf{100},kv){=}49.50495$, and $\epsilon(\mathbf{100}){=}50$, respectively, the errors do not match. Accordingly, replacing the currently-selected path passing through the cell y with the path passing through A for the FF100 (path 100) clearly improves the magnitude of compatibility to reduce the provisional cost C(kv').

In the circuit example of FIGS. 8-10, if a combination kv' is generated after an activated path passing through the cells y and x with an activated path passing through the cells A and x for one of the FF1-FF100 (paths 1-100), the magnitude of compatibility is improved by the same extent as the above case of the FF100 (path 100). Accordingly, the provisional cost C(kv') reduces by the same amount as the above case of the FF100 (path 100). Specifically, the generator 11 repeats the processing of steps S21-S24 of FIG. 6 100 times for the combination kv=(1, 1, . . . , 1, 1) and derives 100 provisional costs C(kv') having the same amount of improvement. For the above, one of the 100 combinations kv' is randomly selected and generated as a new combination kv of failure candidates in the process of step S25 of FIG. 6. Here, a combination kv'=(1, 1, . . . , 1, 0) is generated by replacing the failure candidate of the FF100 (path 100) and then undergo the processing of step S3 of FIG. 4, that is the processing of steps S10-S14 of FIG. 5, in the same manner as the above. As detailed above, a failure candidate that is previously replaced in a combination kv' of failure candidates that is selected as the combination kv' that reduces (minimizes) the provisional cost C(kv') the most is excluded from a failure candidate to be replaced in step S21, that is, the replaced failure candidate is excluded from the determination of step S24.

Hereinafter, each time the failure analyzing apparatus 1 carries out the processing of a loop from step S7 to step S3 of FIG. 4 once, one of the elements in the combination kv of failure candidates is switched from 1 to 0, so that the currently selected path passing through the cell y of one corresponding FFn (path n) is replaced with a path passing through the cell A. After the failure analyzing apparatus 1 carries out the processing of the above loop 99 times, paths each passing through the cell A are selected for all of the FF1-FF100 (path 1 through path 100) and therefore all the elements of the combination kv of failure candidates are 0, that is, kv=(0, 0, ..., 0).

The weighs X(x), X(y), and X(A) calculated in step S12 of FIG. 5 for the combination kv=(0, 0, ..., 0) are $$X(x)=1.1\times10^{-14}, X(y)=-1\times10^{-14}, \text{ and } X(A)=60.$$

A correlation between three cells x, y, and A and an error $\epsilon(n)$ of each FFn is provided by the following Formula (9).

$$f(Nx,Ny,NA)=1.1\times10^{-14}\times Nx-1\times10^{-14}\times Ny+60\times NA \quad (9)$$

At this time, the determination coefficient is the maximum value of 1 and the cost is the minimum value of 0. Therefore, the determinator 14 outputs the optimum combination $kv_{best}$=(0, 0, ..., 0) of failure candidates and the function $f(kv_{best})$ of Formula (9) corresponding to the optimum combination $kv_{best}$=(0, 0, ..., 0) in step S8 of FIG. 4.

(5) Second Embodiment

The specific example of first embodiment depicted in FIGS. 8-10 assumes the number of kinds of failure factor (i.e., cell type) is three. When the number M of failure factors is large, there is a possibility to take time to accomplish the optimization that seeks the optimum combination $kv_{best}$ of failure candidates. However, in most cases, an actual failure is caused only small part of a large number of failure factors.

For the above, a second embodiment to be detailed below selects m (1≤m<M) failure factors from the M failure factors, and determines the optimum combination $kv_{best}$ of failure candidates of the selected m failure factors and the corresponding function $f(kv_{best})$ in the same manner as that of the first embodiment. Then, the magnitude of compatibility of the determined function $f(kv_{best})$ is calculated and the combination of m failure factors that maximizes the magnitude of compatibility is selected among all the $_MC_m$ combinations prepared by selecting m failure factors from M failure factors. In other words, failure analysis is carried out using only amounts of feature to be focused (i.e., m failure factors), and m failure factors that maximize the magnitude of compatibility of the function $f(kv_{best})$ derived as the result of the analysis are searched, so that the function $f(kv_{best})$ is optimized and a failure factor is estimated from the form of the function $f(kv_{best})$ that has the largest magnitude of compatibility.

A magnitude of compatibility is a degree of coincidence of an error $\epsilon'(n, kv_{best})$ calculated by the function $f(kv_{best})$ with an error $\epsilon(n)$ based on the result of measurement on the actual chip. Since the second embodiment compares magnitudes of compatibility of functions $f(kv_{best})$ different in number and type of failure factors on the basis of the same criterion, the inverse of sum square of the difference between the result of the analysis and the measured value is not suitable for a magnitude of compatibility, which is preferably related to a criterion that is unchanged even when the number or the kinds of failure factors is changed. For this reason, the second embodiment uses, as a magnitude of compatibility, a correlation coefficient (determination coefficient) between $\epsilon'(n, kv_{best})$ and $\epsilon(n)$ that approaches 1 as increasing the degree of coincidence of $\epsilon'(n, kv_{best})$ with $\epsilon(n)$. In the second embodiment, since the number of failure factors is restricted to m, the number of explanatory variables is not suitably used for a magnitude of compatibility.

(5-1) Configuration of a Failure Analyzing Apparatus of a Second Embodiment:

FIG. 11 is a block diagram illustrating a functional configuration of a failure analyzing apparatus 1A according to the second embodiment.

The failure analyzing apparatus 1A of FIG. 11 has the same configuration as that of the above failure analyzing apparatus 1. In the failure analyzing apparatus 1A, the processor 10 includes functions of a selector 15 and a compatibility calculator 16 in addition to the functions of the generator 11, the analyzer 12, the cost calculator 13, and the determinator 14. The added functions as the selector 15 and the compatibility calculator 16 are also realized by the processor executing the failure analyzing program.

Here, the selector 15 may randomly select m (1≤m<M) failure factors from the M failure factors or through a genetic algorithm that regards combinations of m failure factors as genes.

If the selector 15 randomly selects the m failure factors, the combination (to be subjected to a failure analysis) is selected from $_MC_m$ combinations.

On the other hand, if the selector 15 adopts a genetic algorithm, (1, 6, M−1) is regarded as a gene for the first, the sixth, and the (M−1)-th failure candidates among M failure factors is regarded as a gene under conditions of, for example, m=3. In this case, a number of combinations assigned by the user are prepared as genes beforehand. On the basis of the prepared combinations, selection or mutation is made on two of the prepared combination for each generation. Combinations generated by selection and mutation are regarded as the result of the selection by the selector 15 and then output.

For the m failure factors selected by the selector 15, the generator 11, the analyzer 12, the cost calculator 13, and the determinator derive the optimum combination $kv_{best}$ and the function $f(kv_{best})$ along the procedure of the first embodiment.

The compatibility calculator 16 calculates a magnitude S of compatibility of the derived function $f(kv_{best})$. In the second embodiment, a magnitude S of compatibility is a correlation coefficient between the $\epsilon'(n, kv_{best})$ and $\epsilon(n)$ as detailed above. The compatibility calculator 16 may calculate a magnitude S of compatibility on the basis of the function $f(kv_{best})$, or may use the magnitude S of compatibility that the cost calculator 13 calculates to derive a corresponding cost. This means that that cost calculator 13 can also function as the compatibility calculator 16.

The determinator 14 determines, among the combinations of failure factors selected by the selector 15, a combination of $kv_{best}$ of failure candidates derived on the basis of the combination that maximizes the magnitude S of compatibility derived by the compatibility calculator 16 to be the combination of failure candidates that minimizes the cost. Then the determinator 14 outputs the magnitude $S_{best}$ of compatibility calculated on the basis of the determined combination of the failure factors, the combination $kv_{best}$ of failure candidates of the combination of failure factors, and the function $f(kv_{best})$ based on the combination $kv_{best}$ of failure candidates. The processor 10 estimates the failure factor from the form of the function $f(kv_{best})$ in the same manner as the steps (iv) of the above general failure analysis.

(5-2) Operation of the Failure Analyzing Apparatus of the Second Embodiment:

Next, description will now be made in relation to analysis performed by the failure analyzing apparatus 1A of the second embodiment with reference to the flowchart (steps S30-S37) of FIG. 12.

First of all, the input information (1)-(3) described above item (3-1) is read from the memory 20 and input into the processor 10, and a number m of failure factors that are to be selected from M failure factors is input into the processor 10 by the instruction of the designer or the like (step S30). As the input information (1)-(3), information of $K_1 \times K_2 \times \ldots \times K_P$ combinations of failure candidates (the number of failure candidates $K_i$ (i=1, 2, . . . , P)), and a list associating delay errors (or failure rates) $\epsilon(n,kv)$ with amounts $a(m, n, kv)$ of feature are read and input into the processor 10 similarly to the first embodiment. The number m of failure elements is preferably set to a value in the range of 1-3.

In the processor 10, the selector 15 selects m failure factors from the M failure factors as the initial combination, and sets the initial value of the maximum magnitude $S_{best}$ of compatibility to the minimum value $-\infty$ (step S31). The initial combination may include m failure factors randomly selected from the M failure factors. Alternatively, if a genetic algorithm is adopted, the initial combination may include genes derived as the first generation.

Upon the initial values are derived, the procedure of FIGS. 4-6 are carried out on the selected m failure factors by the generator 11, the analyzer 12, the cost calculator 13, and the determinator 14 in the same manner as that of the first embodiment, so that the optimum combination $kv_{best}$ of failure candidates and the corresponding function $f(kv_{best})$ are derived (step S32). The magnitude S of compatibility of the derived function $f(kv_{best})$ is calculated by the compatibility calculator 16 or the function of calculating a magnitude of compatibility of the cost calculator 13. The determinator 14 compares the calculated magnitude S of compatibility with the maximum magnitude $S_{best}$ of compatibility (step S33). If the comparison results in $S_{best}<S$ (YES route in step S33), the maximum magnitude $S_{best}$ of compatibility is replaced with the magnitude S of compatibility that calculated most recently and the combination kv of the failure candidates derived for the m failure factors selected for this time is replaced with and the regarded as the optimum combination (optimum solution) $kv_{best}$ (step S34).

After the maximum magnitude $S_{best}$ of compatibility and the optimum combination $kv_{best}$ of failure candidates are replaced, the determinator 14 determines whether the loop termination condition is satisfied (step S35). The loop termination condition is, if the selector 15 randomly selects m failure factors, completion of selecting all the $_MC_m$ combination of failure factors. If the selector 15 adopts a genetic algorithm to the selection, the loop termination condition is that the number of generations subjected to the processing reaches a predetermined number or that the optimum solution $kv_{best}$ is not written for a longer time than a predetermined period of time.

If the loop termination condition is not satisfied (NO route in step S35), the selector 15 selects a different combination including m failure factors through the greedy algorithm or the genetic algorithm (step S36). Then, processing of steps S32-35 is carried out on m failure factors selected in step S36.

On the other hand, if the comparison results in $S_{best} \geq S$ in step S33 (No route), step S34 is skipped and step S35 is subsequently carried out.

If the loop termination condition is determined to be satisfied in step S35 (YES route), the determinator 14 outputs the current maximum magnitude $S_{best}$ of compatibility, the optimum combination $kv_{best}$, and the function $f(kv_{best})$ related to the selection for the optimum combination $kv_{best}$ (step S37). The processor 10 estimates a failure factor from the form of the function $f(kv_{best})$ in the same manner as the step (iv) of the above general failure analysis.

As the above, the failure analyzing apparatus 1A of the second embodiment ensures the similar effects as the failure analyzing apparatus 1 of the first embodiment, and is additionally capable of accomplishing a failure analysis only on amounts of characteristic to be focused (i.e., m failure factors). As a result of analysis performed in the above manner, m failure factors that maximize the magnitude of compatibility of the function $f(kv_{best})$ derived are specified. Thereby, the function $f(kv_{best})$ is optimized, and a failure factor is estimated from the form of the function $f(kv_{best})$, which has the largest magnitude of compatibility. Accordingly, even under the presence of a large number M of failure factors, m failure factor related to the failure can be specified in a short time, so that the failure factor can be rapidly and precisely estimated.

In step S37, the determinator 14 outputs a combination of failure candidates that maximizes the magnitude S of compatibility. Alternatively, the determinator 14 may output combinations of failure candidates related to a predetermined number of the largest magnitude of compatibility, the functions corresponding to the combinations, and the magnitudes S of compatibility. In this case, the designer can overall determine the failure factor with reference to a number of combinations of failure candidates related to large magnitudes S of compatibility and the functions corresponding to the combinations, so that the failure factor can be more precisely estimated.

(6) Others

Preferred embodiments of the present invention are detailed above. However, the present invention is by no means limited to the embodiments, and various changes and modifications can be suggested without departing from the gist of the present invention.

A speed path analysis adopted in the above embodiment regards only a cell type (the number of being used) on a path as a failure factor (i.e., an amount of feature). However, the failure factor is not limited to a cell type, and may alternatively be a wiring length of a path, the number of low-power transistors on a path, whether a path passes through a designated region. The present invention is applied to any of the above alternatives, which ensure the same effects and advantages as the above embodiments.

An error cause analysis adopted in the above embodiments regards a wiring layer (i.e., a wiring length of each wiring layer) as a failure factor (an amount of feature). However, the failure factor is not limited to a wiring layer, which may be replaced by another. The present invention can be applied to another failure factor, which ensures the same effects and advantages as the above.

Part or the entire function of the generator 11, the analyzer 12, the cost calculator 13, the determinator 14, the selector 15, and the compatibility calculator 16 is realized by a computer (including a CPU, an information processor, and another terminal) executing a predetermined application program (a failure analyzing program).

The programs may be provided in the form of being stored in a computer-readable recording medium, such as a flexible disk, a CD (e.g., CD-ROM, CD-R, CD-RW), a DVD (e.g., DVD-ROM, DVD-RAM, DVD-R, DVD-RW, DVD+R, DVD+RW), and a Blu-ray disk. In this case, a computer reads the programs from the recording medium and sends the read programs to an internal or external memory to store for use.

Here, a computer is a concept of a combination of hardware and an OS and means hardware which operates under control of the OS. Otherwise, if an application program operates hardware independently of an OS, the hardware corresponds to the computer. Hardware includes at least a microprocessor such as a CPU and means to read a computer program recorded in a recording medium. The above failure analyzing program includes program codes that cause a computer as the above to realize the functions of the respective sections 11-16.

Alternatively, part of the functions may be carried out by the OS, not by the application program.

All examples and conditional language recited herein are intended for pedagogical purposes to aid the reader in understanding the invention and the concepts contributed by the inventor to furthering the art, and are to be construed as being without limitation to such For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A non-transitory computer-readable recording medium which stores a failure analyzing program that derives a function that provides a correlation between a plurality of failure factors and an error or a failure rate of each of a plurality of failure elements indicating occurrence of a failure of an actual chip on the basis of result of measurement on the actual chip and estimates a correct failure factor on the basis of the derived function, the failure analyzing program instructing a computer to execute:
   if each of the plurality of failure elements includes a number of failure candidates including a first failure factor that causes the failure in the element,
   generating a combination of failure candidates one for each of the plurality of failure elements;
   deriving the function based on the generated combination of failure candidates;
   calculating a cost of the derived function; and
   selecting one of a plurality of the generated combinations of failure candidates that minimizes the cost.

2. The non-transitory computer-readable recording medium according to claim 1, the failure analyzing program instructing the computer to execute calculating, as the cost, the inverse of a magnitude of compatibility, for each of the plurality of failure element, between a value measured on the actual chip and a value calculated by the derived function.

3. The non-transitory computer-readable recording medium according to claim 1, when the derived function is derived through a linear regression analysis, the failure analyzing program instructing the computer to execute calculating, as the cost, the number of weights larger than a threshold among a weight of the first failure factor of the derived function.

4. The non-transitory computer-readable recording medium according to claim 1, the failure analyzing program instructing the computer to further execute:
   generating a plurality of provisional combination of failure candidates each derived by replacing one of the failure candidates of the combination on the basis of which the derived function is derived with another failure candidate;
   calculating a plurality of provisional costs of the derived function one for each of the plurality of provisional combinations; and
   regarding one of the plurality of provisional combinations that minimizes the provisional cost as the combination of failure candidates.

5. The non-transitory computer-readable recording medium according to claim 1, the failure analyzing program instructing the computer to execute generating the combination of failure candidates through a genetic algorithm that regards the combination of failure candidates as a gene.

6. The non-transitory computer-readable recording medium according to claim 1, the failure analyzing program instructing the computer to execute:
   selecting the first failure factor from a plurality of second failure factors more than the first failure factor;
   calculating a plurality of magnitudes of compatibility of the derived function, corresponding one to each of the plurality of the combinations of failure candidates for the first failure factor selected;
   determining one of the plurality of the combinations of failure candidate of the first factors selected that maximizes the magnitude of compatibility as the combination of failure candidate that minimizes the cost.

7. The non-transitory computer-readable recording medium according to claim 6, wherein each of the plurality of magnitudes of compatibility is a correlation coefficient, for each of plurality of failure element, between a value measured on the actual chip and a value calculated from the derived function.

8. A failure analyzing apparatus for deriving a function that provides a correlation between a plurality of failure factors and an error or a failure rate of each of a plurality of failure elements indicating occurrence of a failure of an actual chip on the basis of result of measurement on the actual chip and estimating a correct failure factor on the basis of the derived function, the apparatus comprising:
   a generator that generates, if each of the plurality of failure elements includes a number of failure candidates including a first failure factor that causes the failure in the element, a combination of failure candidates one for each of the plurality of failure elements;
   an analyzer that derives the function based on the combination of failure candidates generated by the generator;
   a cost calculator that calculates a cost of the function derived by the analyzer; and
   a determinator that selects one of a plurality of the combinations generated by the generator that minimizes the cost calculated by the cost calculator.

9. The failure analyzing apparatus according to claim 8, wherein the cost calculator calculates, as the cost, the inverse of a magnitude of compatibility, for each of the plurality of failure elements, between a value measured on the actual chip and a value calculated by the derived function.

10. The failure analyzing apparatus according to claim 9, wherein the magnitude of compatibility is the inverse of the sum square of a difference, for each of the plurality of failure elements, between the value measured on the actual chip and the value calculated from the derived function.

11. The failure analyzing apparatus according to claim 9, wherein the magnitude of compatibility is a correlation coefficient, for each of the plurality of failure elements, between the value measured on the actual chip and the value calculated from the derived function.

12. The failure analyzing apparatus according to claim 8, wherein when the analyzer derives the derived function through a linear regression analysis, the cost calculator calculates, as the cost, the number of weights larger than a threshold among a weight of the first failure factor of the derived function.

13. The failure analyzing apparatus according to claim 8, wherein the generator
   generates a plurality of provisional combinations of failure candidates each derived by replacing one of the failure candidates of the combination on the basis of which the derived function is derived by the analyzer with another failure candidate;

calculates a plurality of provisional costs of the derived function one for each of the plurality of provisional combinations; and regards one of the plurality of provisional combinations that minimizes the provisional cost as the combination of failure candidates.

14. The failure analyzing apparatus according to claim 13, wherein the generator calculates, as one of the plurality of provisional costs, the inverse of a magnitude of compatibility, for each of the plurality of failure elements, between a value measured on the actual chip and a value calculated by the derived function.

15. The failure analyzing apparatus according to claim 8, wherein the generator generates the combination of failure candidates through a genetic algorithm that regards the combination of failure candidates as a gene.

16. The failure analyzing apparatus according to claim 8, further comprising:

a selector that selects the first failure factor from a plurality of second failure factors more than the first failure factor; and a compatibility calculator that calculates a plurality of magnitudes of compatibility of the derived function, corresponding one to each of the plurality of the combinations of failure candidates for the first failure factor selected by the selector, wherein the determinator determines one of the plurality of the combinations of failure candidate of the first failure factor that is selected by the selector and that maximizes the magnitude of compatibility as the combination of failure candidate that minimizes the cost.

17. The failure analyzing apparatus according to claim 16, wherein the selector randomly selects the first failure factor from the plurality of second failure factors.

18. The failure analyzing apparatus according to claim 16, wherein the selector selects the first failure factor through a genetic algorithm that regards the combination of a plurality of the first failure factor as a gene.

19. The failure analyzing apparatus according to claim 16, wherein the magnitude of compatibility is a correlation coefficient, for each of plurality of failure element, between a value measured on the actual chip and a value calculated from the derived function.

20. A method for failure analysis that, on a computer, derives a function that provides a correlation between a plurality of failure factors and an error or a failure rate of each of a plurality of failure elements indicating occurrence of a failure of an actual chip on the basis of result of measurement on the actual chip and estimates a correct failure factor on the basis of the derived function, the method comprising:

if each of the plurality of failure elements includes a number of failure candidates including a first failure factor that causes the failure in the element, generating a combination of failure candidates one for each of the plurality of failure elements;

deriving the function based on the generated combination of failure candidates;

calculating a cost of the derived function; and selecting one of a plurality of the generated combinations of failure candidates that minimizes the cost.

* * * * *